United States Patent
Yamazaki et al.

(10) Patent No.: US 10,008,630 B2
(45) Date of Patent: Jun. 26, 2018

(54) DISPLAY DEVICE

(71) Applicant: SEMICONDUCTOR ENERGY LABORATORY CO., LTD., Atsugi-shi, Kanagawa-ken (JP)

(72) Inventors: Shunpei Yamazaki, Tokyo (JP); Yoshiharu Hirakata, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days. days.

(21) Appl. No.: 13/962,999

(22) Filed: Aug. 9, 2013

(65) Prior Publication Data

US 2014/0054582 A1    Feb. 27, 2014

(30) Foreign Application Priority Data

Aug. 23, 2012  (JP) ................. 2012-184336

(51) Int. Cl.
| | |
|---|---|
| *H01L 29/10* | (2006.01) |
| *H01L 33/00* | (2010.01) |
| *H01L 29/786* | (2006.01) |
| *H01L 27/12* | (2006.01) |
| *H01L 51/52* | (2006.01) |

(52) U.S. Cl.
CPC ...... *H01L 33/0041* (2013.01); *H01L 27/1222* (2013.01); *H01L 29/7869* (2013.01); *H01L 29/78606* (2013.01); *H01L 51/5246* (2013.01); *H01L 2924/0002* (2013.01)

(58) Field of Classification Search
CPC ............. H01L 51/5246; H01L 33/0041; H01L 27/1222; H01L 29/78606; H01L 29/7869; H01L 2924/0002

USPC ............................................ 257/43; 438/104
See application file for complete search history.

(56) References Cited

U.S. PATENT DOCUMENTS

| | | | |
|---|---|---|---|
| 6,160,346 | A  | 12/2000 | Vleggaar et al. |
| 6,204,907 | B1 | 3/2001  | Hiraishi et al. |
| 6,288,764 | B1 | 9/2001  | Zhang |
| 6,441,879 | B2 | 8/2002  | Hiraishi et al. |
| 6,605,826 | B2 | 8/2003  | Yamazaki et al. |

(Continued)

FOREIGN PATENT DOCUMENTS

| | | |
|---|---|---|
| EP | 2672478 A   | 12/2013 |
| JP | 09-090373 A | 4/1997 |

(Continued)

*Primary Examiner* — Eric Ward
*Assistant Examiner* — Eric Ashbahian
(74) *Attorney, Agent, or Firm* — Nixon Peabody LLP; Jeffrey L. Costellia

(57) ABSTRACT

An inorganic insulating film containing nitrogen, which has high adhesion to a sealant and an excellent effect of blocking hydrogen, water, and the like, is used as a layer in contact with the sealant. Further, the sealant is provided on the outer side than a side surface of an end portion of the organic insulating film provided over the transistor or the inorganic insulating film containing nitrogen is provided to cover an area from a region which is on the outer side than the edge of the organic insulating film to the side surface and the top surface of the end portion of the organic insulating film. Accordingly, the entry of hydrogen, water, and the like existing outside the display device into the oxide semiconductor included in the transistor can be suppressed, so that the display device can have high reliability.

12 Claims, 10 Drawing Sheets

(56) References Cited

U.S. PATENT DOCUMENTS

| | | | |
|---|---|---|---|
| 6,924,508 B2 | 8/2005 | Yoneda et al. | |
| 6,924,594 B2 | 8/2005 | Ogura et al. | |
| 7,572,478 B2 | 8/2009 | Ogura et al. | |
| 7,674,650 B2 | 3/2010 | Akimoto et al. | |
| 7,792,489 B2 | 9/2010 | Hirakata et al. | |
| 8,040,487 B2 | 10/2011 | Hayashi | |
| 8,208,107 B2 | 6/2012 | Hayashi | |
| 8,432,097 B2 | 4/2013 | Hirakata et al. | |
| 8,633,044 B2 | 1/2014 | Hara et al. | |
| 8,669,556 B2 | 3/2014 | Yamazaki et al. | |
| 8,680,522 B2 | 3/2014 | Yamazaki et al. | |
| 8,785,240 B2 | 7/2014 | Watanabe | |
| 8,884,849 B2 | 11/2014 | Masuda | |
| 8,988,623 B2 | 3/2015 | Koyama et al. | |
| 8,994,021 B2 | 3/2015 | Yamazaki et al. | |
| 9,030,097 B2 | 5/2015 | Hirakata et al. | |
| 9,331,208 B2 | 5/2016 | Yamazaki et al. | |
| 9,488,890 B2 | 11/2016 | Koyama et al. | |
| 9,502,680 B2 | 11/2016 | Hirakata et al. | |
| 9,711,655 B2 | 7/2017 | Yamazaki et al. | |
| 9,859,523 B2 | 1/2018 | Hirakata et al. | |
| 2003/0089991 A1* | 5/2003 | Yamazaki et al. | 257/759 |
| 2007/0051952 A1* | 3/2007 | Yamazaki | G02F 1/1368 |
| | | | 257/59 |
| 2007/0072439 A1* | 3/2007 | Akimoto et al. | 438/795 |
| 2010/0237362 A1 | 9/2010 | Okabe | |
| 2011/0111558 A1* | 5/2011 | Yamazaki et al. | 438/104 |
| 2012/0104933 A1* | 5/2012 | Jung et al. | 313/498 |
| 2012/0168788 A1* | 7/2012 | Moriya et al. | 257/89 |
| 2012/0314148 A1* | 12/2012 | Yamaguchi | H01L 51/5246 |
| | | | 349/42 |
| 2013/0270549 A1 | 10/2013 | Okazaki et al. | |
| 2013/0299820 A1 | 11/2013 | Miyamoto et al. | |
| 2014/0001466 A1* | 1/2014 | Sasaki | H01L 29/247 |
| | | | 257/43 |
| 2017/0059909 A1 | 3/2017 | Koyama et al. | |
| 2017/0309754 A1 | 10/2017 | Yamazaki et al. | |

FOREIGN PATENT DOCUMENTS

| | | |
|---|---|---|
| JP | 2004-063126 A | 2/2004 |
| JP | 2005-209631 A | 8/2005 |
| JP | 2007-096055 | 4/2007 |
| JP | 2007-123861 | 5/2007 |
| JP | 2007-128741 A | 5/2007 |
| JP | 2007-248743 A | 9/2007 |
| JP | 2008-281988 A | 11/2008 |
| JP | 2008-288376 A | 11/2008 |
| JP | 2009-139394 A | 6/2009 |
| JP | 2011-070797 A | 4/2011 |
| JP | 2011-118377 A | 6/2011 |
| JP | 2012-134475 A | 7/2012 |
| WO | WO-2008/126879 | 10/2008 |
| WO | WO-2009/054159 | 4/2009 |
| WO | WO-2011/052382 | 5/2011 |
| WO | WO-2012/011268 | 1/2012 |
| WO | WO-2012/073844 | 6/2012 |
| WO | WO-2012/105189 | 8/2012 |

* cited by examiner

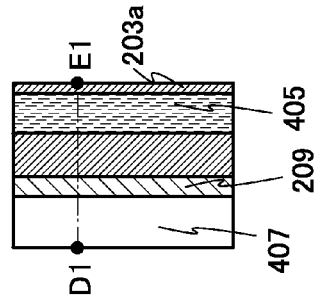
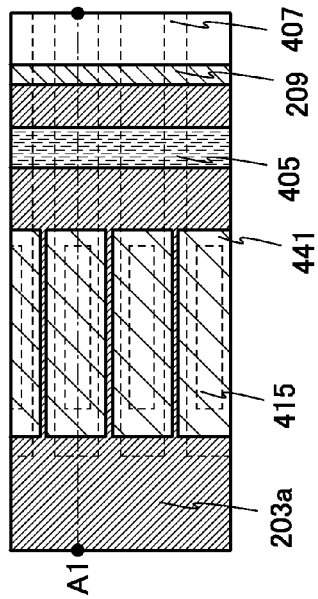
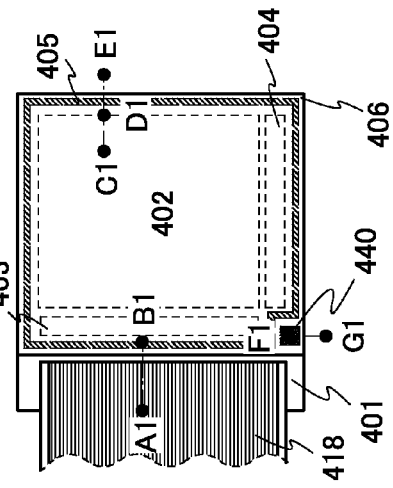
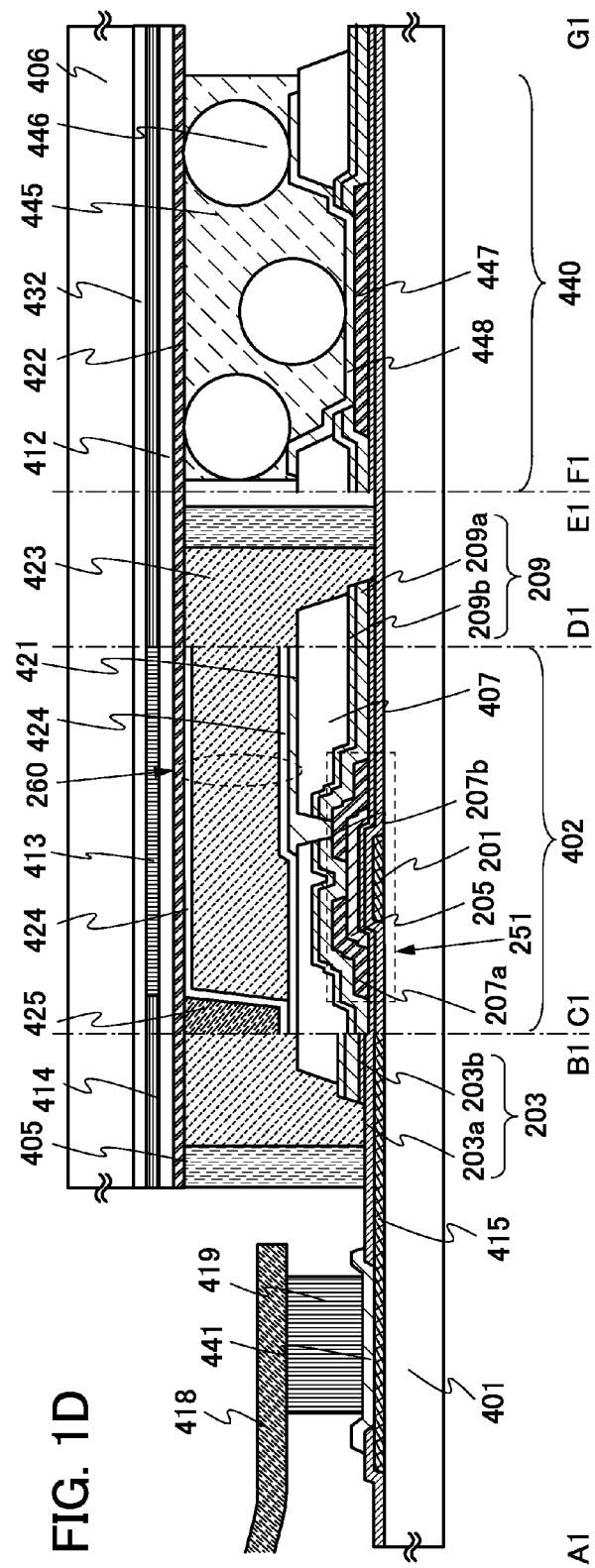

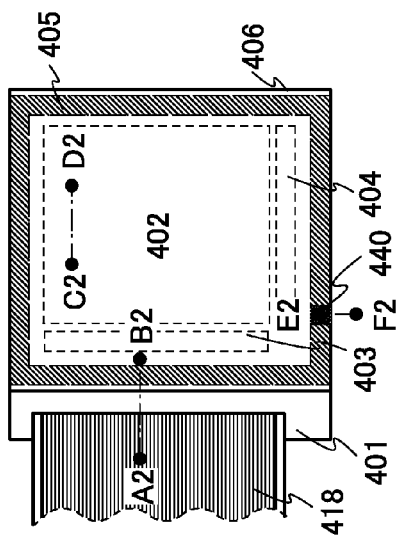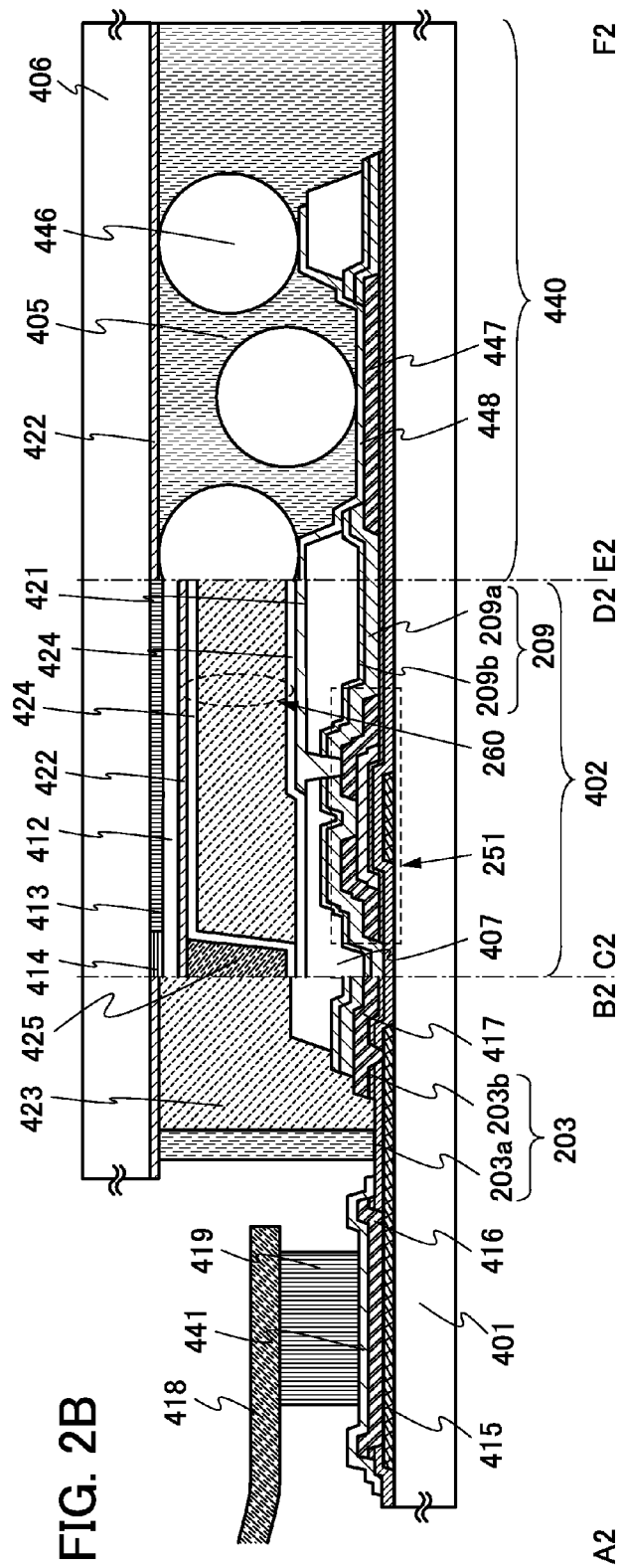

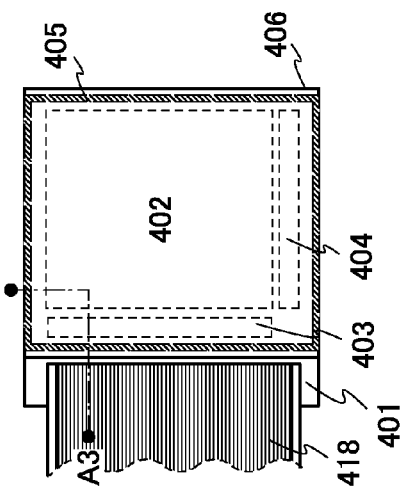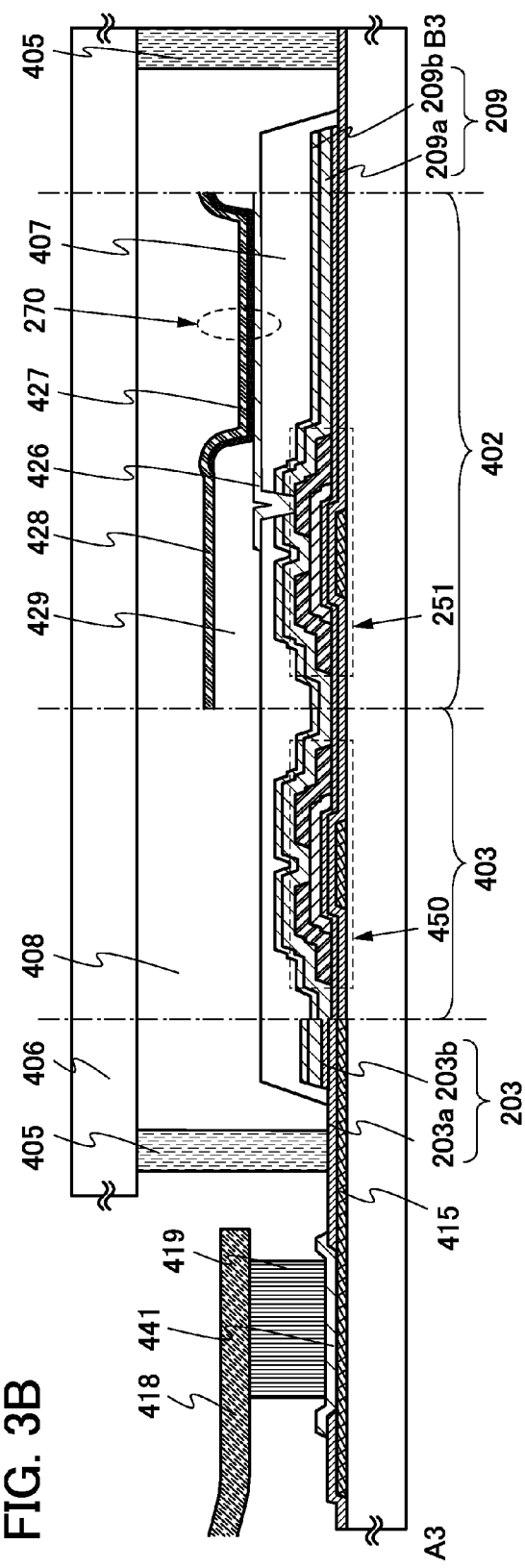
FIG. 3A
FIG. 3B

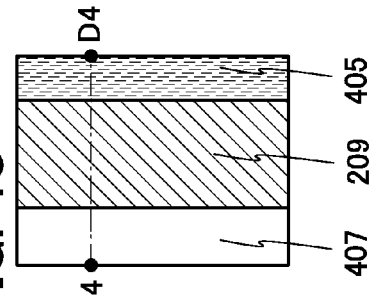
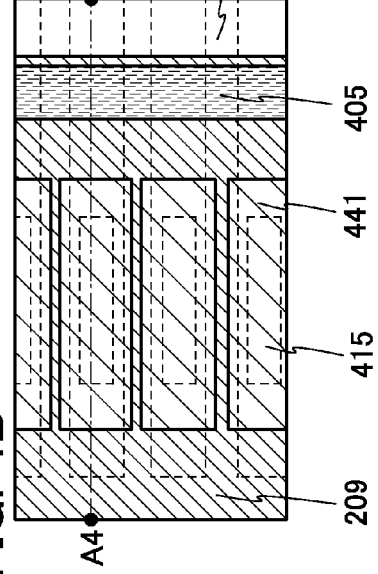
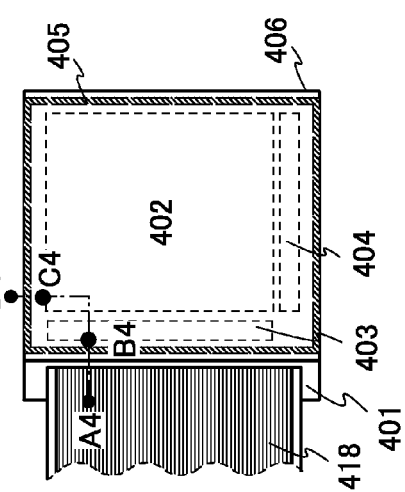
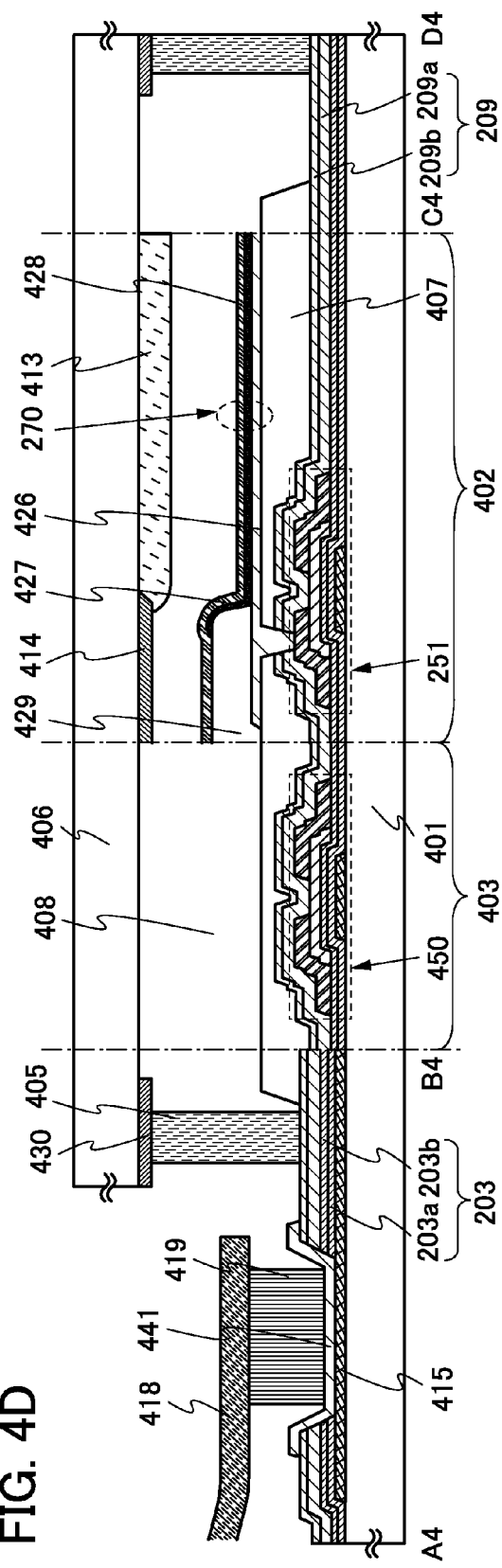

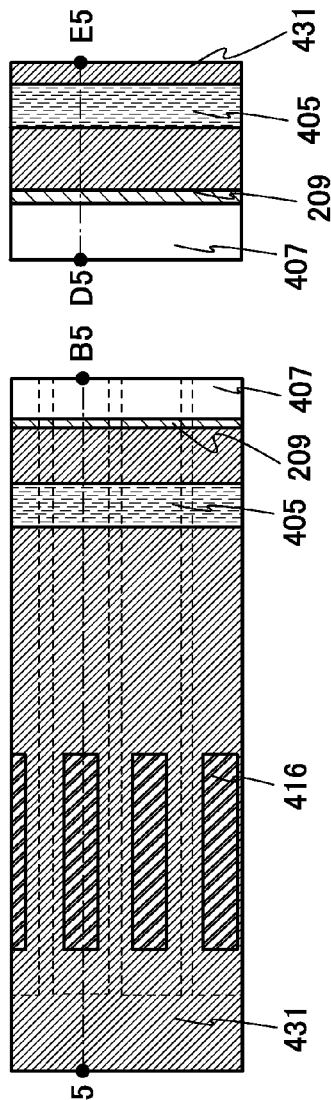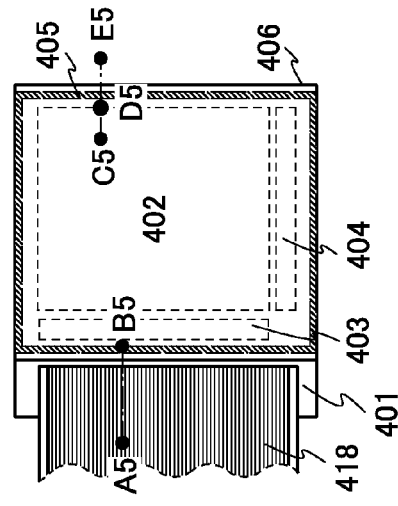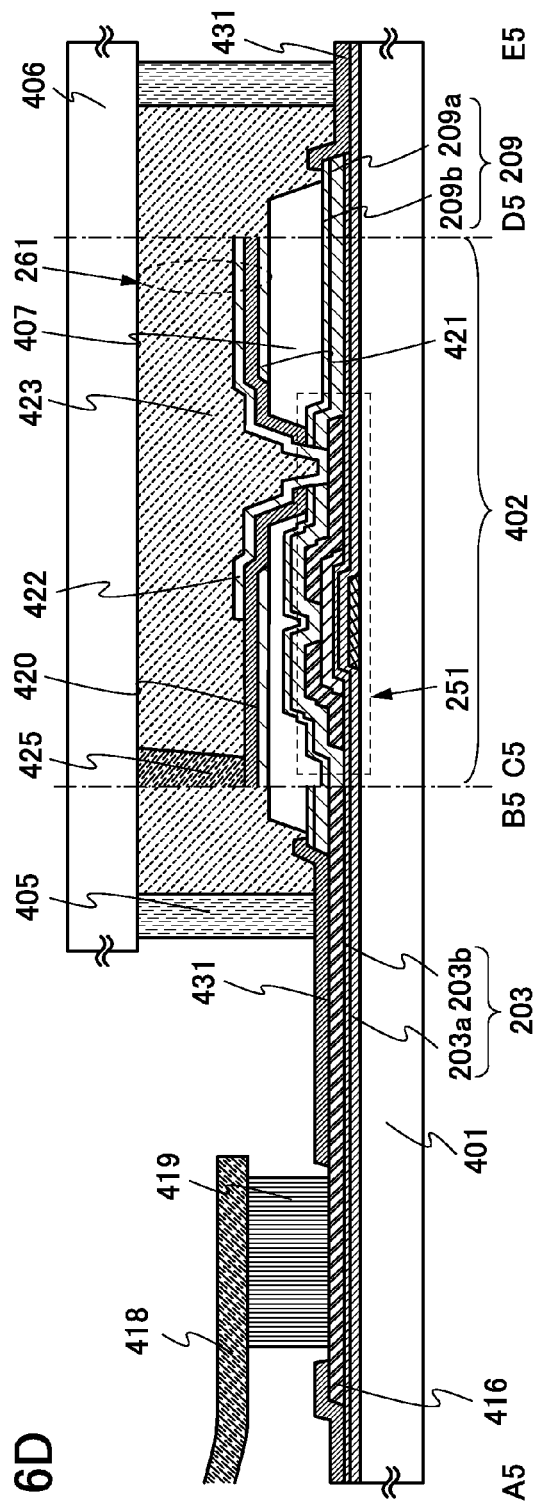
FIG. 6A  FIG. 6B  FIG. 6C  FIG. 6D

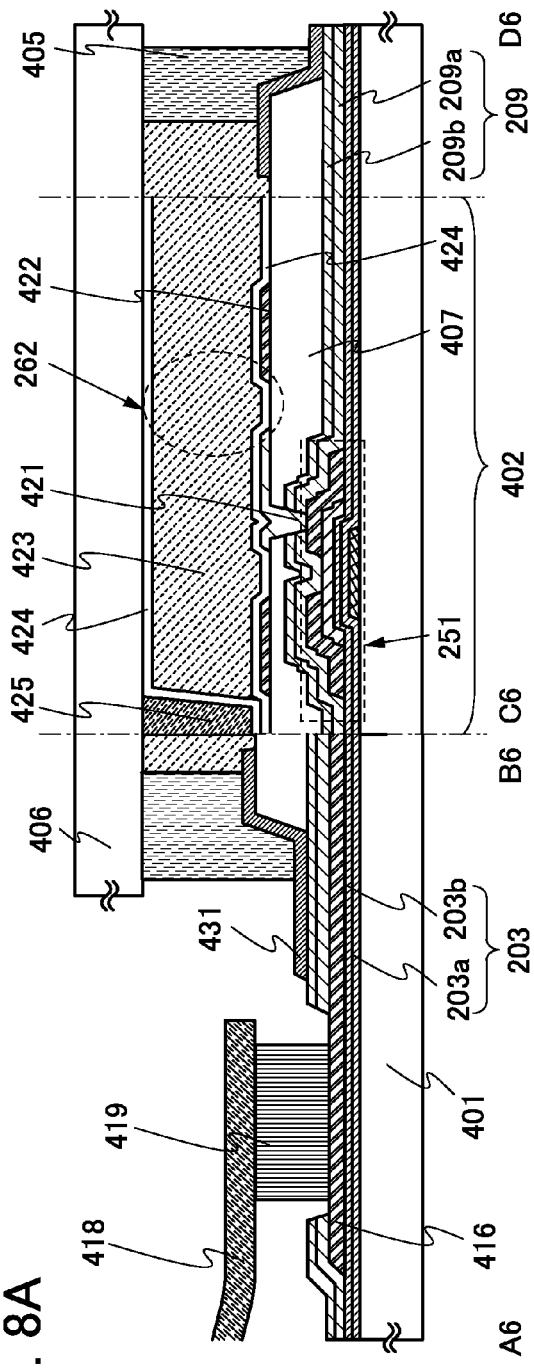

DISPLAY DEVICE

BACKGROUND OF THE INVENTION

1. Field of the Invention

The present invention relates to a display device including a transistor which includes an oxide semiconductor.

2. Description of the Related Art

A technique by which transistors are formed using semiconductor thin films over a substrate having an insulating surface has been attracting attention. The transistor is used in a wide range of electronic devices such as an integrated circuit (IC) and a display device. A silicon-based semiconductor material is widely known as a material for a semiconductor thin film which can be used in a transistor. As another material, an oxide semiconductor has been attracting attention.

For example, a technique for forming a transistor using zinc oxide or an In—Ga—Zn—based oxide semiconductor as an oxide semiconductor is disclosed (see Patent Documents 1 and 2).

REFERENCE

[Patent Document 1] Japanese Published Patent Application No. 2007-123861
[Patent Document 2] Japanese Published Patent Application No. 2007-096055

SUMMARY OF THE INVENTION

However, the electric conductivity of an oxide semiconductor is changed, for example, when deviation from the stoichiometric composition due to deficiency of oxygen, or the like occurs, or hydrogen or water forming an electron donor enters the oxide semiconductor. Such a phenomenon is a factor of change in the electrical characteristics of a display device including a transistor which includes an oxide semiconductor.

For that reason, it is necessary to suppress not only the entry of moisture or the like into an oxide semiconductor in a manufacturing process of a display device but also the entry of moisture or the like into an oxide semiconductor from the outside of the display device after fabrication of the device.

Thus, an object of one embodiment of the present invention is to provide a highly reliable display device including a transistor which includes an oxide semiconductor.

A display device of one embodiment of the present invention includes a transistor which includes an oxide semiconductor and is provided over a first substrate; an organic insulating film which is provided over the transistor; and a display element which is provided over the organic insulating film and is electrically connected to the transistor. Further, the display device includes a second substrate provided so as to face a surface (also referred to as a first surface) of the first substrate over which the transistor and the like are formed; and a sealant which is provided like a frame surrounding the transistor and bonds the first substrate and the second substrate together. In the display device, the sealant is in contact with an inorganic insulating film containing nitrogen on the first substrate side and a side surface of an end portion of the organic insulating film is not exposed to the air, whereby the entry of hydrogen and water existing outside the display device into the oxide semiconductor included in the transistor can be suppressed.

Specifically, one embodiment of the present invention is a display device including a first substrate which has a first surface provided with a transistor including a first inorganic insulating film containing nitrogen and provided between a gate electrode and an oxide semiconductor layer and source and drain electrodes electrically connected to the oxide semiconductor layer, an organic insulating film provided over the transistor, and a display element provided over the organic insulating film and electrically connected to the source and drain electrodes; a second substrate which is provided so as to face the first surface; and a sealant which is provided like a frame surrounding the transistor and bonds the first substrate and the second substrate together. The sealant is in contact with the first inorganic insulating film and is on the outer side than a side surface of an end portion of the organic insulating film.

The inorganic insulating film containing nitrogen has high adhesion to the sealant and has an excellent effect of blocking hydrogen, water, and the like. Thus, when the sealant is in contact with the first inorganic insulating film containing nitrogen, the entry of hydrogen and water existing outside the display device into the interface between the first inorganic insulating film and the sealant and into the first inorganic insulating film can be suppressed. Accordingly, it is possible to suppress the entry of hydrogen and water existing outside the display device into the oxide semiconductor included in the transistor in the display device.

In the above display device, the sealant is provided on the outer side than the side surface of the end portion of the organic insulating film provided over the transistor, so that the side surface of the end portion of the organic insulating film is not exposed to the air. Therefore, the entry of moisture or the like in the air into the display device, moreover, the transistor (e.g., the oxide semiconductor), through the organic insulating film can be suppressed.

Another embodiment of the present invention is a display device including a first substrate which has a first surface provided with a transistor including a gate insulating film provided between a gate electrode and an oxide semiconductor layer and source and drain electrodes electrically connected to the oxide semiconductor layer, a first inorganic insulating film containing nitrogen and covering the transistor, an organic insulating film provided over the first inorganic insulating film, and a display element provided over the organic insulating film and electrically connected to the source electrode or the drain electrode; a second substrate which is provided so as to face the first surface of the first substrate; and a sealant which is provided like a frame surrounding the transistor and bonds the first substrate and the second substrate together. The sealant is in contact with the first inorganic insulating film and is on the outer side than a side surface of an end portion of the organic insulating film.

The above structure where the first inorganic insulating film containing nitrogen, which has an excellent effect of blocking hydrogen, water, and the like, covers the transistor enables the entry of hydrogen and water existing outside the transistor into the oxide semiconductor to be suppressed. Thus, it is possible to suppress even the entry of hydrogen and water existing in the display device as well as the entry of hydrogen and water existing outside the display device into the oxide semiconductor.

Another embodiment of the present invention is a display device including a first substrate which has a first surface provided with a transistor including a gate insulating film provided between a gate electrode and an oxide semiconductor layer and source and drain electrodes electrically connected to the oxide semiconductor layer, an organic insulating film provided over the transistor, a first inorganic insulating film containing nitrogen and covering an area from a region which is on the outer side than an edge of the organic insulating film to a side surface and the top surface of an end portion of the organic insulating film, and a display element provided over the organic insulating film and is electrically connected to the source electrode or the drain electrode; a second substrate which is provided so as to face the first surface of the first substrate; and a sealant which is provided like a frame surrounding the transistor and bonds the first substrate and the second substrate together. The sealant is in contact with the first inorganic insulating film and at least partly or wholly overlaps with the organic insulating film.

The first inorganic insulating film containing nitrogen, which has an excellent effect of blocking hydrogen, water, and the like, covers an area from a region which is on the outer side than the edge of the organic insulating film to the side surface and the top surface of the end portion of the organic insulating film; thus, the side surface of the end portion of the organic insulating film is not exposed to the air. Therefore, the entry of moisture or the like in the air into the display device, moreover, the transistor (e.g., the oxide semiconductor), through the organic insulating film can be suppressed.

With the above structure where at least part or the whole of the sealant overlaps with the organic insulating film, the frame size can be made small.

In the display device of one embodiment of the present invention, glass is preferably used as the sealant.

An inorganic material such as glass has a lower moisture permeability than an organic material such as a resin; thus, the entry of hydrogen and water existing outside the display device into the sealant can be suppressed. Accordingly, it is possible to suppress the entry of hydrogen and water existing outside the display device into the oxide semiconductor included in the transistor.

In the display device of one embodiment of the present invention, an inorganic insulating film containing nitrogen, which has high adhesion to the sealant and an excellent effect of blocking hydrogen, water, and the like, is used as a layer in contact with the sealant. Further, the sealant is provided on the outer side than the side surface of the end portion of the organic insulating film provided over the transistor or the inorganic insulating film containing nitrogen is provided to cover an area from a region which is on the outer side than the edge of the organic insulating film to the side surface and the top surface of the end portion of the organic insulating film, whereby the side surface of the end portion of the organic insulating film is not exposed to the air. Accordingly, the entry of hydrogen, water, and the like existing outside the display device into the oxide semiconductor included in the transistor can be suppressed, so that the display device is less likely to be changed in electrical characteristics due to hydrogen, water, and the like and thus can have high reliability.

BRIEF DESCRIPTION OF THE DRAWINGS

In the accompanying drawings:

FIGS. 1A to 1D illustrate an example of a display device of one embodiment of the present invention;

FIGS. 2A and 2B illustrate an example of a display device of one embodiment of the present invention;

FIGS. 3A and 3B illustrate an example of a display device of one embodiment of the present invention;

FIGS. 4A to 4D illustrate an example of a display device of one embodiment of the present invention;

FIGS. 6A to 6D illustrate an example of a display device of one embodiment of the present invention;

FIGS. 8A and 8B each illustrate an example of a display device of one embodiment of the present invention;

DETAILED DESCRIPTION OF THE INVENTION

Figure 5:
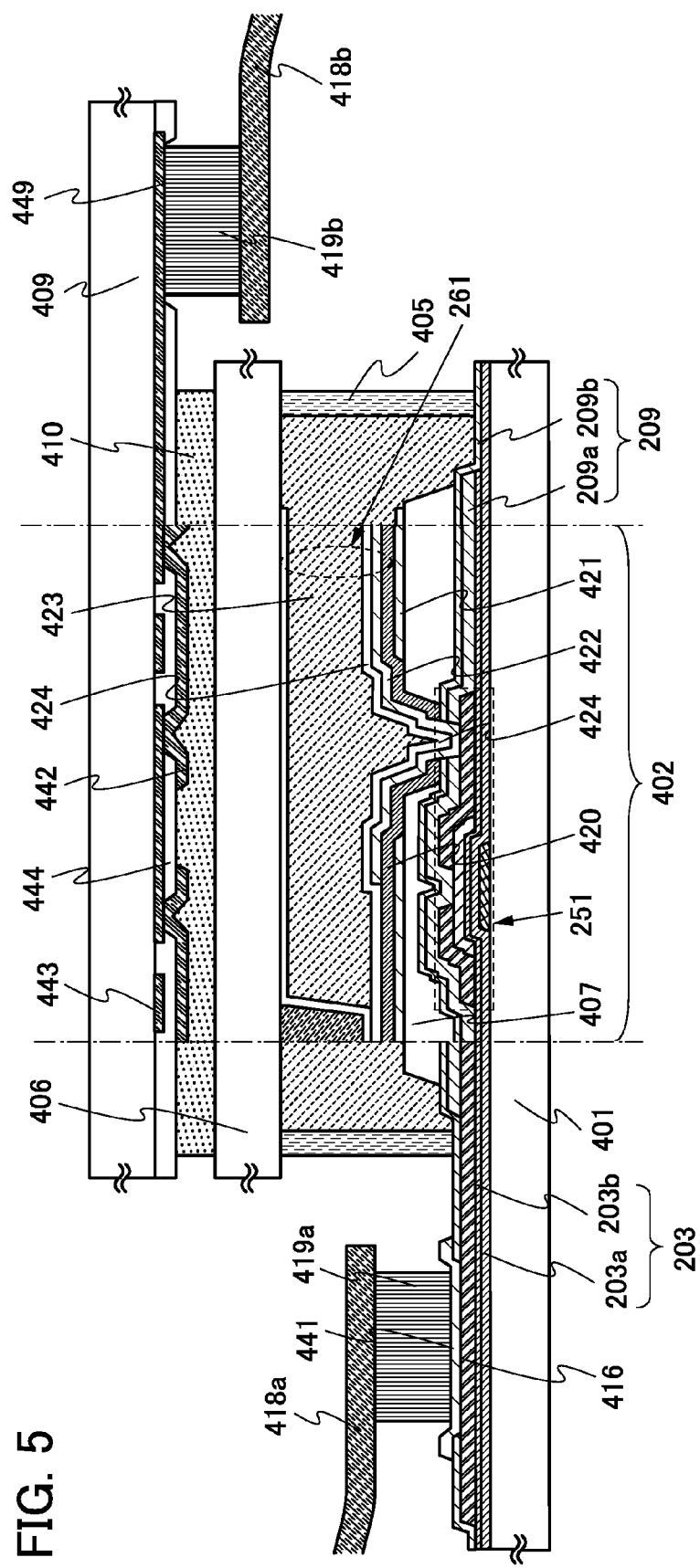
FIG. 5 illustrates an example of a display device of one embodiment of the present invention.

Embodiments of the present invention will be described with reference to the drawings. Note that the present invention is not limited to the following description, and it will be easily understood by those skilled in the art that various changes and modifications can be made without departing from the spirit and scope of the present invention. Thus, the present invention should not be interpreted as being limited to the following description of the embodiments. Note that in the structures of the invention described below, the same portions or portions having similar functions are denoted by the same reference numerals in different drawings, and description of such portions is not repeated.

Embodiment 1

In this embodiment, display devices of embodiments of the present invention will be described with reference to FIGS. 1A to 1D, FIGS. 2A and 2B, FIGS. 3A and 3B, FIGS. 4A to 4D, FIG. 5, FIGS. 6A to 6D, FIGS. 7A and 7B, and FIGS. 8A and 8B. Note that the present invention is not limited to the structural examples described in this embodiment. Further, any of the structures can be combined as appropriate.

A display device of one embodiment of the present invention includes a transistor which includes an oxide semiconductor and is provided over a first substrate; an organic insulating film which is provided over the transistor; and a display element which is provided over the organic insulating film and is electrically connected to the transistor. Further, a first inorganic insulating film containing nitrogen is provided over the first substrate. Furthermore, the display device includes a second substrate provided so as to face a surface (first surface) of the first substrate over which the first inorganic insulating film is formed; and a sealant which is provided like a frame surrounding the transistor and bonds the first substrate and the second substrate together. The sealant is in contact with the first inorganic insulating film on the first substrate side.

The inorganic insulating film containing nitrogen has high adhesion to the sealant and has an excellent effect of blocking hydrogen, water, and the like. Thus, when the sealant is in contact with the first inorganic insulating film containing nitrogen, the entry of hydrogen and water existing outside the display device into the interface between the first inorganic insulating film and the sealant and into the first inorganic insulating film can be suppressed. Accordingly, it is possible to suppress the entry of hydrogen and water existing outside the display device into the oxide semiconductor included in the transistor in the display device.

As the first inorganic insulating film, for example, any of the following can be used: an inorganic insulating film provided between the first substrate and the transistor, which serves as a base film or the like of the transistor, an inorganic insulating film included in the transistor or the display element, which serves as a gate insulating film or the like, and an inorganic insulating film provided between the transistor and the organic insulating film or over the organic insulating film, which serves as a protective film of the transistor or the display element.

In a display device of one embodiment of the present invention, the first inorganic insulating film containing nitrogen is provided between the first substrate and the organic insulating film, and the sealant is in contact with the first inorganic insulating film and is on the outer side than a side surface of an end portion of the organic insulating film, on the first substrate side.

In the above display device, the sealant is provided on the outer side than the side surface of the end portion of the organic insulating film provided over the transistor, so that the side surface of the end portion of the organic insulating film is not exposed to the air. Therefore, the entry of moisture or the like in the air into the display device, moreover, the transistor (e.g., the oxide semiconductor), through the organic insulating film can be suppressed.

In a display device of another embodiment of the present invention, the first inorganic insulating film containing nitrogen covers an area from a region which is on the outer side than the edge of the organic insulating film to the side surface and the top surface of the end portion of the organic insulating film, and the sealant is in contact with the first inorganic insulating film and at least partly or entirely overlaps with the organic insulating film, on the first substrate side.

In the display device, the first inorganic insulating film containing nitrogen, which has an excellent effect of blocking hydrogen, water, and the like, covers an area from a region which is on the outer side than the edge of the organic insulating film to the side surface and the top surface of the end portion of the organic insulating film; thus, the side surface of the end portion of the organic insulating film is not exposed to the air. Therefore, the entry of moisture or the like in the air into the display device, moreover, the transistor (e.g., the oxide semiconductor), through the organic insulating film can be suppressed.

Structural Example 1

FIG. 1A is a plan view illustrating a display device of one embodiment of the present invention. FIG. 1B is an enlarged plan view along a dashed-dotted line A1-B1 in FIG. 1A. FIG. 1C is an enlarged plan view along a dashed-dotted line D1-E1 in FIG. 1A. FIG. 1D is a cross-sectional view taken along dashed-dotted lines A1-B1, C1-D1, D1-E1, and F1-G1 in FIG. 1A. Note that in the plan view used in this embodiment, part of the structure may be omitted.

The display device in FIG. 1A includes, over a substrate 401, a pixel portion 402, a signal line driver circuit 403, a scan line driver circuit 404, and a flexible printed circuit (FPC) 418. The sealant 405 is provided like a frame surrounding the pixel portion 402, the signal line driver circuit 403, and the scan line driver circuit 404, and bonds the substrate 401 and a substrate 406 together. The display device may further be provided with a protective circuit for protecting the driver circuit.

The signal line driver circuit 403 and the scan line driver circuit 404 each include a plurality of transistors. As the signal line driver circuit 403 and the scan line driver circuit 404, any of a variety of circuits such as a CMOS circuit, a PMOS circuit, or an NMOS circuit can be used. In one embodiment of the present invention, part or all of the driver circuit which includes the transistor can be formed over an insulating surface where the pixel portion is formed, whereby a system-on-panel can be formed. Alternatively, the driver circuit may be provided in a position different from the insulating surface where the pixel portion is formed.

Over the substrate 401, a lead wiring for connecting an external input terminal through which a signal (e.g., a video signal, a clock signal, a start signal, or a reset signal) or a potential from the outside is transmitted to the driver circuit is provided. Here, an example is described in which the FPC 418 is provided as the external input terminal. Note that a printed wiring board (PWB) may be attached to the FPC 418.

As the display element included in the pixel portion 402, a liquid crystal element (liquid crystal display element), a light-emitting element (light-emitting display element), or the like can be used. The light-emitting element includes, in its category, an element whose luminance is controlled by current or voltage, and specifically includes, in its category, an inorganic electroluminescence (EL) element and an organic EL element.

Further, an electronic paper in which electronic ink is driven can be provided as the display device. The electronic paper is also called an electrophoretic display device (electrophoretic display) and has advantages in that it has the same level of readability as regular paper, it has less power consumption than other display devices, and it can have a thin and light form.

The pixel portion 402 and the driver circuit of the display device each include a plurality of transistors. In the display device of one embodiment of the present invention, a transistor which includes an oxide semiconductor may be provided in either the pixel portion 402 or the driver circuit formed over the same substrate as the pixel portion 402. Note that at least one transistor which includes an oxide semiconductor should be provided in a space formed by bonding the pair of substrates with the sealant 405. In FIG. 1D, a transistor 251 including an oxide semiconductor is provided in the pixel portion 402.

The transistor 251 includes a gate electrode 201 over the substrate 401, a gate insulating film 203 over the gate electrode 201, an oxide semiconductor layer 205 which overlaps with the gate electrode 201 with the gate insulating film 203 interposed therebetween, and a pair of electrodes 207a and 207b (source and drain electrodes) which is electrically connected to the oxide semiconductor layer 205. The gate insulating film 203 in the transistor 251 includes a first gate insulating film 203a in contact with the gate electrode 201 and a second gate insulating film 203b in contact with the oxide semiconductor layer 205.

Further, the pixel portion 402 is provided with a protective film 209 which covers the transistor 251. The protective film 209 includes a first protective film 209a in contact with the oxide semiconductor layer 205 and a second protective film 209b over the first protective film 209a.

In this embodiment, a silicon nitride film is used as the first gate insulating film 203a, and a silicon oxide film containing nitrogen is used as the second gate insulating film 203b.

In this embodiment, a silicon oxide film containing nitrogen is used as the first protective film 209a, and a silicon nitride film is used as the second protective film 209b.

Note that in each structural example, layers except the layers in contact with the sealant 405 are not necessarily inorganic insulating films containing nitrogen.

In this embodiment, the second gate insulating film 203b and the first protective film 209a are each a silicon oxide film containing nitrogen; thus, in etching the first protective film 209a, a portion of the second gate insulating film 203b which is in contact with the first protective film 209a is also partly removed in some cases. For this reason, the second gate insulating film 203b in a region where the first protective film 209a is removed by etching or the like is not illustrated (a portion of the second gate insulating film 203b in contact with the first protective film 209a is regarded as being also removed) in some cases; however, the second gate insulating film 203b is not necessarily partly removed.

An organic insulating film 407 is provided over the protective film 209, and a liquid crystal element 260 electrically connected to the transistor 251 is provided over the organic insulating film 407. The liquid crystal element 260 is a vertical electric field type liquid crystal element where an electric field is generated in the direction perpendicular to a substrate surface. The liquid crystal element 260 includes a lower electrode 421 electrically connected to the electrode 207b, an upper electrode 422 provided over the substrate 406, and a liquid crystal layer 423.

Insulating films each serving as an alignment film 424 are provided between the lower electrode 421 and a liquid crystal layer 423 and between the upper electrode 422 and the liquid crystal layer 423 so that the liquid crystal layer 423 is sandwiched between the insulating films.

A spacer 425 is a columnar spacer obtained by selective etching of an insulating film and is provided in order to control the thickness of the liquid crystal layer 423 (cell gap). Alternatively, a spherical spacer may be used.

A wiring 415 and a wiring 441 are electrically connected to the FPC 418 through an anisotropic conductive film 419. In this embodiment, as a material of the wiring 441, a conductive oxide such as an indium tin oxide is used. Here, it is preferable to form the wiring 441 in a region where the wiring 415 is not covered with the first gate insulating film 203a because oxidation of the wiring 415 can be prevented. Note that in the case where the wiring 415 is formed using a material which is not easily oxidized or a conductive oxide, the wiring 441 does not necessarily have to be provided. Further, the wiring 415 is preferably covered with the first gate insulating film 203a, in which case the inorganic insulating film containing nitrogen is in contact with the sealant 405 and thus the adhesion to the sealant 405 can be increased. The wiring 415 is formed using the same conductive layer as the gate electrode 201 of the transistor 251, and the wiring 441 is formed using the same conductive layer as the lower electrode 421 of the liquid crystal element 260. It is preferable to form a wiring using the same material and the same step as those of a conductive layer included in an element as in each structural example described in this embodiment in terms of simplification of a fabrication process of a display device.

Further, a base film 432 is provided on the substrate 406, a color filter 413 and a black matrix 414 are provided on the base film 432, and an overcoat layer 412 is provided on the color filter 413 and the black matrix 414.

As illustrated in FIGS. 1A and 1D, in Structural Example 1, a common connection portion (common contact portion) 440 of the liquid crystal element 260 is provided outside a region where the substrate 401 and the substrate 406 are bonded to each other with the sealant 405.

In the common connection portion 440, the substrate 401 is provided with the gate insulating film 203, the wiring 447, and the wiring 448 in this order, and the substrate 406 is provided with the base film 432, a black matrix 414 and the overcoat layer 412, and an upper electrode 422 in this order. A resin layer 445 containing conductive particles 446 is provided between the substrate 401 and the substrate 406. With the conductive particles 446, the wiring 447 and the wiring 448 provided on the substrate 401 side are electrically connected to the upper electrode 422 provided on the substrate 406 side. For the resin layer 445, a resin which can be used for the sealant 405 can be used; however, either a material which is the same as that of the sealant 405 or a different material can be used.

Here, the sealant 405 is in contact with the first gate insulating film 203a. The first gate insulating film 203a is an inorganic insulating film containing nitrogen and thus has an excellent effect of blocking hydrogen, water, and the like. Further, the adhesion between the sealant 405 and the first gate insulating film 203a is high. Thus, the entry of hydrogen and water existing outside the device into the interface between the sealant 405 and the first gate insulating film 203a and into the first gate insulating film 203a can be suppressed. Accordingly, the entry of hydrogen and water existing outside the device into the oxide semiconductor included in the transistor 251 can be suppressed. Moreover, the first gate insulating film 203a can also suppress the entry of moisture contained in the substrate 401, and the like, into the oxide semiconductor layer 205.

The oxide semiconductor layer 205 included in the transistor is entirely covered with the gate insulating film 203 and the protective film 209. Such a structure is preferably employed to suppress the entry of impurities such as moisture contained in each layer which is over the substrate 401 and closer to the substrate 401 than the gate insulating film 203 is (e.g., the base film and the substrate 401) and each layer which is over the substrate 401 and closer to the substrate 406 than the protective film 209 is (e.g., the organic insulating film 407, the display element, and the light-emitting element) into the oxide semiconductor layer 205.

As illustrated in FIGS. 1B to 1D, in Structural Example 1, the sealant 405 is provided on the outer side than a side surface of an end portion of the organic insulating film 407, so that the side surface of the end portion of the organic insulating film 407 is not exposed to the air. Therefore, the entry of moisture and the like in the air into the display device, moreover, the transistor (e.g., the oxide semiconductor), through the organic insulating film 407 can be suppressed.

Structural Example 2

FIG. 2A is a plan view illustrating a display device of one embodiment of the present invention. FIG. 2B is a cross-sectional view taken along dashed-dotted lines A2-B2, C2-D2, and E2-F2 in FIG. 2A.

The display device in FIG. 2A includes, over the substrate 401, the pixel portion 402, the signal line driver circuit 403, the scan line driver circuit 404, and the FPC 418. The sealant 405 is provided like a frame surrounding the pixel portion 402, the signal line driver circuit 403, and the scan line driver circuit 404, and bonds the substrate 401 and a substrate 406 together.

The pixel portion 402 illustrated in FIG. 2B includes the transistor 251, the protective film 209 covering the transistor 251, the organic insulating film 407 over the protective film 209, and the liquid crystal element 260 over the organic insulating film 407. The structures of these components are the same as those of Structural Example 1; thus, the detailed descriptions thereof are omitted. Further, the same applies to the spacer 425, an insulating film serving as the alignment film 424, and the color filter 413, the black matrix 414, and the overcoat layer 412 provided over the substrate 406.

The wiring 415, the wiring 416, the wiring 417, and the wiring 441 are electrically connected to the FPC 418 through the anisotropic conductive film 419. Here, it is preferable to form the wiring 441 covering the wiring 416 because oxidation of the wiring 416 can be prevented. Note that in the case where the wiring 416 is formed using a material which is not easily oxidized or a conductive oxide, the wiring 441 does not necessarily have to be provided. Further, it is preferable that the wiring 415 be covered with the first gate insulating film 203a because a layer in contact with the sealant 405 is an inorganic insulating film containing nitrogen and thus the adhesion to the sealant 405 can be increased. The wiring 415 is formed using the same conductive layer as the gate electrode of the transistor 251. The wiring 416 and the wiring 417 are formed using the same conductive layer as a pair of electrodes (source and drain electrodes) of the transistor 251. The wiring 441 is formed using the same conductive layer as the lower electrode 421 of the liquid crystal element 260.

As illustrated in FIGS. 2A and 2B, in Structural Example 2, the common connection portion (common contact portion) 440 of the liquid crystal element 260 is provided inside a region where the substrate 401 and the substrate 406 are bonded to each other with the sealant 405.

In the common connection portion 440, the substrate 401 is provided with the gate insulating film 203, the wiring 447, and the wiring 448 in this order, and the substrate 406 is provided with the upper electrode 422. The common connection portion 440 corresponds to a part of a region where the sealant 405 is provided. A portion of the sealant 405 which corresponds to the common connection portion 440 contains the conductive particle 446. With the conductive particles 446, the wiring 447 and the wiring 448 provided on the substrate 401 side are electrically connected to the upper electrode 422 provided on the substrate 406 side.

Here, in Structural Example 2, the sealant 405 is in contact with the first gate insulating film 203a. The first gate insulating film 203a is inorganic insulating film containing nitrogen and thus has an excellent effect of blocking hydrogen, water, and the like. Further, the adhesion between the sealant 405 and the first gate insulating film 203a is high. Thus, the entry of hydrogen and water existing outside the device into the interface between the sealant 405 and the first gate insulating film 203a and into the first gate insulating film 203a can be suppressed. Accordingly, the entry of hydrogen and water existing outside the device into the oxide semiconductor included in the transistor 251 can be suppressed. Moreover, the first gate insulating film 203a can also suppress the entry of moisture contained in the substrate 401, and the like, into the oxide semiconductor layer 205.

The oxide semiconductor layer 205 included in the transistor is entirely covered with the gate insulating film 203 and the protective film 209. Such a structure is preferably employed to suppress the entry of impurities such as moisture contained in each layer which is closer to the substrate 401 than the gate insulating film 203 is and each layer which is closer to the substrate 406 than the protective film 209 is into the oxide semiconductor layer 205.

Further, in Structural Example 2, the sealant 405 is provided on the outer side than a side surface of an end portion of the organic insulating film 407, so that the side surface of the end portion of the organic insulating film 407 is not exposed to the air. Therefore, the entry of moisture and the like in the air into the display device, moreover, the transistor (e.g., the oxide semiconductor), through the organic insulating film 407 can be suppressed.

Structural Example 3

FIG. 3A is a plan view illustrating a display device of one embodiment of the present invention. FIG. 3B is a cross-sectional view taken along a dashed-dotted line A3-B3 in FIG. 3A.

The display device in FIG. 3A includes, over the substrate 401, the pixel portion 402, the signal line driver circuit 403, the scan line driver circuit 404, and the FPC 418. The sealant 405 is provided like a frame surrounding the pixel portion 402, the signal line driver circuit 403, and the scan line driver circuit 404, and bonds the substrate 401 and a substrate 406 together. As illustrated in FIG. 3B, the transistor 251, a transistor 450, and a light-emitting element 270, and the like are provided in a space 408 formed by bonding the substrate 401 and the substrate 406 together with the sealant 405.

The pixel portion 402 and the driver circuit of the display device each include a plurality of transistors. FIG. 3B illustrates the transistor 251 included in the pixel portion 402 and the transistor 450 included in the signal line driver circuit 403. The transistor 251 is the same as that in Structural Example 1; thus, the detailed description thereof is omitted. The transistor 450 has the same structure as the transistor 251; thus, the detailed description thereof is omitted.

A conductive layer may further be provided so as to overlap with a channel formation region in the oxide semiconductor layer of a driver circuit transistor (e.g., the transistor 450). For example, a conductive layer may be provided over the protective film 209 or over the organic insulating film 407. In that case, the amount of change in the threshold voltage of the transistor can be reduced. The potential of the conductive layer may be the same as or different from that of a gate electrode of the transistor. The conductive layer can also serve as a second gate electrode. The potential of the conductive layer may be GND or 0 V.

The conductive layer also has a function of blocking an external electric field, that is, a function of preventing an external electric field (in particular, a function of preventing static electricity) from influencing the inside (a circuit portion including a transistor). The blocking function of the conductive layer can prevent the variations in electrical characteristics of the transistor due to the influence of external electric field such as static electricity.

Further, the pixel portion 402 and the signal line driver circuit 403 are provided with the protective film 209 covering the transistor 251 and the transistor 450. The structure of the protective film 209 is the same as that of Structural Example 1; thus, the detailed description thereof is omitted.

The organic insulating film 407 is provided over the protective film 209, and a light-emitting element 270 electrically connected to the transistor 251 is provided over the organic insulating film 407. As the light-emitting element 270, a light-emitting element utilizing electroluminescence can be used. In this embodiment, an organic EL element is used. The light-emitting element 270 includes a lower electrode 426, an electroluminescent layer 427, and an upper electrode 428. At least one of the lower electrode 426 and the upper electrode 428 transmits light. An end portion of the lower electrode 426 is covered with a partition 429.

Further, in Structural Example 3, the sealant 405 is provided in an end portion of the display device. Such a structure is preferable to Structural Example 6 described below (FIG. 7A) and the like in terms of a reduction in frame size.

The wiring 415 and the wiring 441 are electrically connected to the FPC 418 through the anisotropic conductive film 419. Here, it is preferable to form the wiring 441 in a region where the wiring 415 is not covered with the first gate insulating film 203a because oxidation of the wiring 415 can be prevented. Further, the wiring 415 is preferably covered with the first gate insulating film 203a, in which case the inorganic insulating film containing nitrogen is in contact with the sealant 405 and thus the adhesion to the sealant 405 can be increased. The wiring 415 is formed using the same conductive layer as the gate electrode of the transistor 251, and the wiring 441 is formed using the same conductive layer as the lower electrode 426 of the light-emitting element 270.

Further, a spacer which adjusts the distance between the substrate 401 and the substrate 406, an auxiliary wiring electrically connected to the upper electrode of the organic EL element may be provided over the partition 429.

In Structural Example 3, the sealant 405 is in contact with the first gate insulating film 203a. The first gate insulating film 203a is an inorganic insulating film containing nitrogen and thus has an excellent effect of blocking hydrogen, water, and the like. Further, the adhesion between the sealant 405 and the first gate insulating film 203a is high. Thus, the entry of hydrogen and water existing outside the device into the interface between the sealant 405 and the first gate insulating film 203a and into the first gate insulating film 203a can be suppressed. Accordingly, the entry of hydrogen and water existing outside the device into the oxide semiconductors included in the transistor 251 and the transistor 450 can be suppressed. Moreover, the first gate insulating film 203a can also suppress the entry of moisture contained in the substrate 401, and the like, into the oxide semiconductor layer 205.

The oxide semiconductor layer 205 included in the transistor is entirely covered with the gate insulating film 203 and the protective film 209. Such a structure is preferably employed to suppress the entry of impurities such as moisture contained in each layer which is closer to the substrate 401 than the gate insulating film 203 is and each layer which is closer to the substrate 406 than the protective film 209 is into the oxide semiconductor layer 205.

Further, in Structural Example 3, the sealant 405 is provided on the outer side than a side surface of an end portion of the organic insulating film 407, so that the side surface of the end portion of the organic insulating film 407 is not exposed to the air. Therefore, the entry of moisture and the like in the air into the display device, moreover, the transistor (e.g., the oxide semiconductor), through the organic insulating film 407 can be suppressed.

Structural Example 4

FIG. 4A is a plan view illustrating a display device of one embodiment of the present invention. FIG. 4B is an enlarged plan view along a dashed-dotted line A4-B4 in FIG. 4A. FIG. 4C is an enlarged plan view along a dashed-dotted line C4-D4 in FIG. 4A. FIG. 4D is a cross-sectional view taken along dashed-dotted lines A4-B4, B4-C4, and C4-D4 in FIG. 4A.

The display device in FIG. 4A includes, over the substrate 401, the pixel portion 402, the signal line driver circuit 403, the scan line driver circuit 404, and the FPC 418. The sealant 405 is provided like a frame surrounding the pixel portion 402, the signal line driver circuit 403, and the scan line driver circuit 404, and bonds the substrate 401 and a substrate 406 together.

The pixel portion 402 illustrated in FIG. 4D includes the transistor 251, the protective film 209 covering the transistor 251, the organic insulating film 407 over the protective film 209, and the light-emitting element 270 over the organic insulating film 407. The signal line driver circuit 403 in FIG. 4D includes the transistor 450. The structures of these components are the same as those of Structural Example 3 (FIG. 3B); thus, the detailed descriptions thereof are omitted.

The light-emitting element 270 in FIG. 4D has a top-emission structure where the upper electrode 428 transmits light. The substrate 406 is provided with the color filter 413 and the black matrix 414.

The wiring 415 and the wiring 441 are electrically connected to the FPC 418 through the anisotropic conductive film 419. Here, it is preferable to form the wiring 441 in a region where the wiring 415 is not covered with the gate insulating film 203 and the protective film 209 because oxidation of the wiring 415 can be prevented. Further, the wiring 415 is preferably covered with the gate insulating film 203 and the protective film 209, in which case the inorganic insulating film containing nitrogen is in contact with the sealant 405 and thus the adhesion to the sealant 405 can be increased. The wiring 415 is formed using the same conductive layer as the gate electrode of the transistor 251, and the wiring 441 is formed using the same conductive layer as the lower electrode 426 of the light-emitting element 270.

In Structural Example 4, the sealant 405 is in contact with the second protective film 209b. The second protective film 209b is an inorganic insulating film containing nitrogen and thus has an excellent effect of blocking hydrogen, water, and the like. Further, the adhesion between the sealant 405 and the second protective film 209b is high. Thus, the entry of hydrogen and water existing outside the device into the interface between the sealant 405 and the second protective film 209b and into the second protective film 209b can be suppressed. Accordingly, the entry of hydrogen and water existing outside the device into the oxide semiconductors included in the transistor 251 and the transistor 450 can be suppressed. Moreover, the second protective film 209b can also suppress the entry of moisture, etc. contained in the organic insulating film 407, the partition 429, and the like, into the oxide semiconductor layer 205.

Further, in this embodiment, the first gate insulating film 203a, the second gate insulating film 203b, the first protective film 209a, and the second protective film 209b are each an inorganic insulating film containing nitrogen. Thus, even when these films exist in an edge portion of the display device, the entry of hydrogen and water existing outside the device into the films can be suppressed. Accordingly, the entry of hydrogen and water existing outside the device into the oxide semiconductors included in the transistor 251 and the transistor 450 can be suppressed.

The oxide semiconductor layer 205 included in the transistor can be said to be entirely covered with the gate insulating film 203 and the protective film 209. Such a structure is preferably employed to suppress the entry of impurities such as moisture contained in each layer which is closer to the substrate 401 than the gate insulating film 203 is and each layer which is closer to the substrate 406 than the protective film 209 is into the oxide semiconductor layer 205.

Further, a portion of the substrate 406 which is in contact with the sealant 405 is provided with an inorganic insulating film 430 containing nitrogen. Depending on a structure of the display device, the substrate 406 is provided with an electrode of a display element, a color filter, a black matrix, or the like. A layer of such a component is not necessarily a layer with high adhesion to the sealant 405. Thus, it is preferable to provide the inorganic insulating film 430 containing nitrogen as a layer in contact with the sealant 405 on the substrate 406. Provision of the inorganic insulating film 430 containing nitrogen helps increase adhesion between the sealant 405 and the layer in contact with the sealant 405 not only on the substrate 401 side but also on the substrate 406 side, leading to higher reliability of the display device.

Further, as illustrated in FIGS. 4B to 4D, in Structural Example 4, the sealant 405 is provided on the outer side than a side surface of an end portion of the organic insulating film 407, so that the side surface of the end portion of the organic insulating film 407 is not exposed to the air. Therefore, the entry of moisture and the like in the air into the display device, moreover, the transistor (e.g., the oxide semiconductor), through the organic insulating film 407 can be suppressed.

Structural Example 5

FIG. 5 is a cross-sectional view illustrating a display device which serves as a touch panel and to which one embodiment of the present invention is applied.

In FIG. 5, the transistor 251, the first protective film 209a covering the transistor 251, and the second protective film 209b over the first protective film 209a are provided over the substrate 401. The structure of the transistor 251 is the same structure as that in Structural Example 1 (FIG. 1D) or the like; thus, the detailed description thereof is omitted.

In Structural Example 5, an end portion of the first protective film 209a is covered with the second protective film 209b. The end portion of the first protective film 209a is in a region surrounded by the substrate 401, the substrate 406, and the sealant 405 which is in contact with the second protective film 209b. The second protective film 209b is an inorganic insulating film containing nitrogen and thus has an excellent effect of blocking hydrogen, water, and the like. Further, the adhesion between the sealant 405 and the second protective film 209b is high. Thus, the entry of hydrogen and water existing outside the device into the interface between the sealant 405 and the second protective film 209b and into the second protective film 209b can be suppressed. Accordingly, the entry of hydrogen and water existing outside the device into the oxide semiconductors included in the transistor 251 and the transistor 450 can be suppressed. Moreover, the second protective film 209b can also suppress the entry of moisture, etc. contained in the organic insulating film 407, the partition 429, and the like, into the oxide semiconductor layer 205.

Further, in this embodiment, the first gate insulating film 203a and the second protective film 209b are each an inorganic insulating film containing nitrogen. Thus, even when these films exist in an end portion of the display device, the entry of hydrogen and water existing outside the device into the films can be suppressed. Accordingly, the entry of hydrogen and water existing outside the device into the oxide semiconductors included in the transistor 251 and the transistor 450 can be suppressed.

The oxide semiconductor layer 205 included in the transistor is entirely covered with the second gate insulating film 203b and the first protective film 209a and is further covered with the first gate insulating film 203a and the second protective film 209b over the second gate insulating film 203b and the first protective film 209a. Such a structure is preferably employed to suppress the entry of impurities such as moisture contained in the device as well as impurities such as moisture existing outside the device into the oxide semiconductor layer 205.

The organic insulating film 407 is provided over the second protective film 209b. In Structural Example 5, the sealant 405 is provided on the outer side than a side surface of an end portion of the organic insulating film 407, so that the side surface of the end portion of the organic insulating film 407 is not exposed to the air. Therefore, the entry of moisture and the like in the air into the display device, moreover, the transistor (e.g., the oxide semiconductor), through the organic insulating film 407 can be suppressed.

A liquid crystal element 261 is provided over the organic insulating film 407. The liquid crystal element 261 is a liquid crystal element to which a fringe field switching (FFS) mode is applied and in which the pair of electrodes, that is, the lower electrode 421 and the upper electrode 422 are formed with the insulating film 420 interposed therebetween.

The upper electrode 422 is electrically connected to one of the pair of electrodes of the transistor 251. In FIG. 5, the size of a contact hole formed in the protective film 209 and the insulating film 420 is smaller than that of a contact hole formed in the organic insulating film 407. The protective film 209 and the insulating film 420 are preferably in contact with each other, in which case the organic insulating film 407 is not exposed and thus impurities such as moisture contained in the organic insulating film 407 can be prevented from entering the transistor 251 (e.g., the oxide semiconductor).

The organic insulating film 407 can release impurities such as moisture remaining therein to the outside of the display device by hear treatment or the like in the fabrication process. Thus, the impurities remaining in the organic insulating film 407 in the fabricated display device can be reduced, leading to higher reliability of the transistor and the display element. For this reason, the structure where the insulating film 420 is provided over part of the organic insulating film 407 is preferable to the structure where the insulating film 420 entirely covers the organic insulating film 407.

The wiring 416 and the wiring 441 are electrically connected to an FPC 418a through an anisotropic conductive film 419a. Here, it is preferable to form the wiring 441 in a region where the wiring 416 is not covered with the protective film 209 because oxidation of the wiring 416 can be prevented. Further, the wiring 416 is preferably covered with the protective film 209, in which case the inorganic insulating film containing nitrogen is in contact with the sealant 405 and thus the adhesion to the sealant 405 can be increased. The wiring 416 is formed using the same conductive layer as the source electrode and the drain electrode of the transistor 251, and the wiring 441 is formed using the same conductive layer as at least one of the pair of the electrodes of the liquid crystal element 261.

The substrate 406 is bonded to a substrate 409 with a resin layer 410 interposed therebetween. The substrate 409 is provided with touch panel electrodes 442 and 443 with an interlayer insulating film 444 interposed therebetween. With these components, the display device of one embodiment of the present invention can serve as a touch panel.

A wiring 449 is electrically connected to an FPC 418b through an anisotropic conductive film 419b. The wiring 449 is formed using the same conductive layer as the touch panel electrode 443.

Note that a polarizing film or an antistatic layer can be provided as appropriate between the substrate 406 and the resin layer 410.

Structural Example 6

FIG. 6A is a plan view illustrating a display device of one embodiment of the present invention. FIG. 6B is an enlarged plan view along a dashed-dotted line A5-B5 in FIG. 6A. FIG. 6C is an enlarged plan view along a dashed-dotted line D5-E5 in FIG. 6A. FIG. 6D is a cross-sectional view taken along dashed-dotted lines A5-B5, C5-D5, and D5-E5 in FIG. 6A.

The display device in FIG. 6A includes, over the substrate 401, the pixel portion 402, the signal line driver circuit 403, the scan line driver circuit 404, and the FPC 418. The sealant 405 is provided like a frame surrounding the pixel portion 402, the signal line driver circuit 403, and the scan line driver circuit 404, and bonds the substrate 401 and the substrate 406 together.

The pixel portion 402 illustrated in FIG. 6D includes the transistor 251, the protective film 209 covering the transistor 251, the organic insulating film 407 over the protective film 209, and the liquid crystal element 261 over the organic insulating film 407. The structures of the transistor 251, the protective film 209, and the organic insulating film 407 are the same as those of Structural Example 1 (FIGS. 1A to 1D) and the structure of the liquid crystal element 261 is the same as that of Structural Example 5 (FIG. 5); thus, the detailed descriptions thereof are omitted.

In Structural Example 6, a liquid crystal composition exhibiting a blue phase is used for the liquid crystal layer 423. It is preferable to use the liquid crystal composition exhibiting a blue phase because an alignment film is unnecessary and thus the fabrication process can be simplified.

The wiring 416 is electrically connected to the FPC 418 through the anisotropic conductive film 419. The wiring 416 is formed using the same conductive layer as a pair of electrodes (source and drain electrodes) of the transistor 251.

In Structural Example 6, the sealant 405 is in contact with the inorganic insulating film 431 containing nitrogen. The inorganic insulating film 431 is formed using the same insulating film as the insulating film 420 included in the liquid crystal element 261 and is formed using a silicon nitride film in this embodiment. The inorganic insulating film 431 has an excellent effect of blocking hydrogen, water, and the like. Further, the adhesion between the sealant 405 and the inorganic insulating film 431 is high. Thus, the entry of hydrogen and water existing outside the device into the interface between the sealant 405 and the inorganic insulating film 431 and into the inorganic insulating film 431 can be suppressed. Accordingly, the entry of hydrogen and water existing outside the device into the oxide transistor 251 can be suppressed.

The inorganic insulating film 431 is an inorganic insulating film containing nitrogen; for example, a silicon nitride film or a silicon nitride oxide film can be used. Alternatively, a nitrogen-containing inorganic insulating film which can be used as the gate insulating film or the protective film described in Embodiment 2 can be used as the inorganic insulating film 431.

The oxide semiconductor layer 205 included in the transistor 251 is entirely covered with the gate insulating film 203 and the protective film 209. Such a structure is preferably employed to suppress the entry of impurities such as moisture contained in each layer which is closer to the substrate 401 than the gate insulating film 203 is and each layer which is closer to the substrate 406 than the protective film 209 is into the oxide semiconductor layer 205.

Further, as illustrated in FIGS. 6B to 6D, in Structural Example 6, the sealant 405 is provided on the outer side than a side surface of an end portion of the organic insulating film 407, so that the side surface of the end portion of the organic insulating film 407 is not exposed to the air. Therefore, the entry of moisture and the like in the air into the display device, moreover, the transistor (e.g., the oxide semiconductor), through the organic insulating film 407 can be suppressed.

Structural Example 7

Figure 7A:
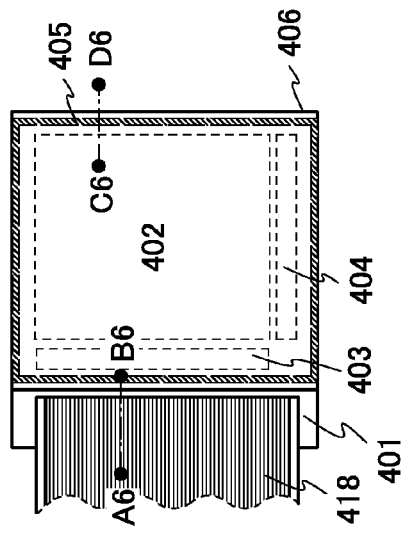
FIGS. 7A and 7B illustrate an example of a display device of one embodiment of the present invention.
Figure 7B:
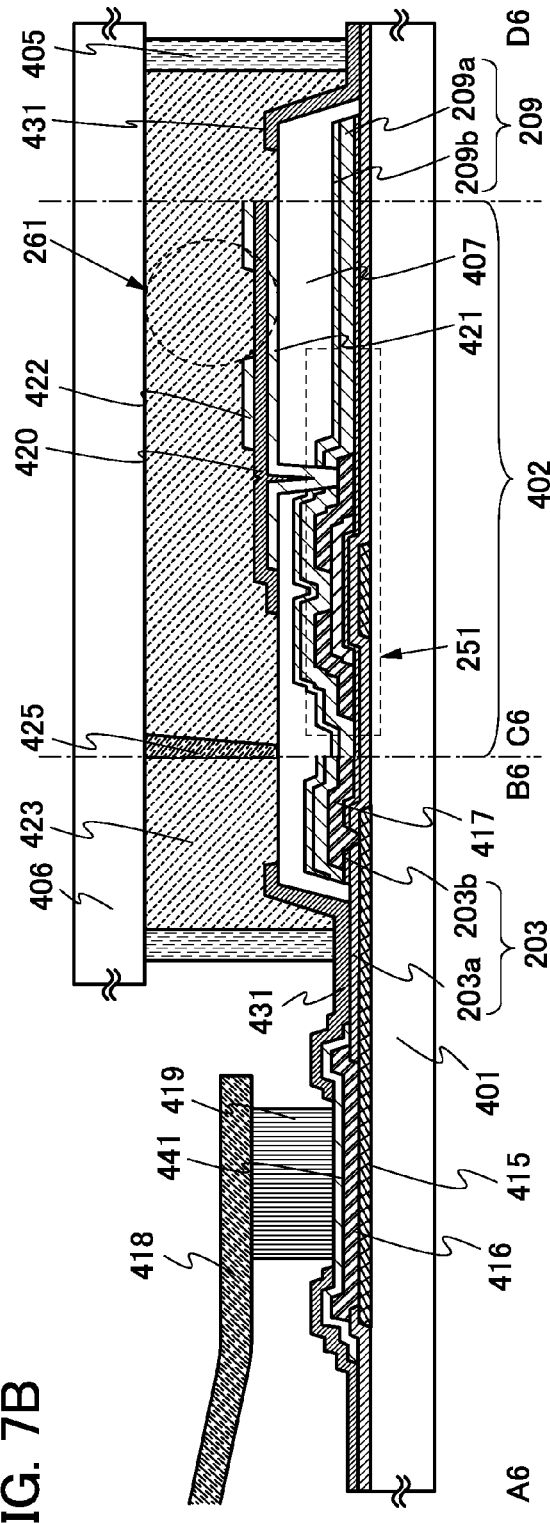

FIG. 7A is a plan view illustrating a display device of one embodiment of the present invention. FIG. 7B is a cross-sectional view taken along dashed-dotted lines A6-B6 and C6-D6 in FIG. 7A.

In FIG. 7B, the transistor 251 and the protective film 209 covering the transistor 251 are provided over the substrate 401. The structures thereof are the same as those of Structural Example 1 or the like; thus, the detailed descriptions thereof are omitted.

The organic insulating film 407 is provided over the protective film 209. In Structural Example 7, the sealant 405 is provided on the outer side than a side surface of an end portion of the organic insulating film 407, so that the side surface of the end portion of the organic insulating film 407 is not exposed to the air. Therefore, the entry of moisture and the like in the air into the display device, moreover, the transistor (e.g., the oxide semiconductor), through the organic insulating film 407 can be suppressed.

The liquid crystal element 261 is provided over the organic insulating film 407. The liquid crystal element 261 is a liquid crystal element to which an FFS mode is applied and in which the pair of electrodes (the lower electrode 421 and the upper electrode 422) are formed with the insulating film 420 interposed therebetween. The lower electrode 421 is electrically connected to one of the pair of electrodes of the transistor 251.

The wiring 415, the wiring 416, the wiring 417, and the wiring 441 are electrically connected to the FPC 418 through the anisotropic conductive film 419. Here, it is preferable to form the wiring 441 covering the wiring 416 because oxidation of the wiring 416 can be prevented. Further, the wiring 441 is preferably covered with the inorganic insulating film 431, in which case the inorganic insulating film 431 is in contact with the sealant 405 and thus the adhesion to the sealant 405 can be increased. The wiring 415 is formed using the same conductive layer as the gate electrode of the transistor 251. The wiring 416 and the wiring 417 are formed using the same conductive layer as the pair of electrodes (source and drain electrodes) of the transistor 251. The wiring 441 is formed using the same conductive layer as the lower electrode 421 or the upper electrode 422 of the liquid crystal element 261. The inorganic insulating film 431 is formed using the same insulating film as the insulating film 420.

In Structural Example 7, the sealant 405 is in contact with the inorganic insulating film 431 containing nitrogen. The inorganic insulating film 431 is formed using the same insulating film as the insulating film 420 included in the liquid crystal element 261 and is formed using a silicon nitride film in this embodiment. The inorganic insulating film 431 has an excellent effect of blocking hydrogen, water, and the like. Further, the adhesion between the sealant 405 and the inorganic insulating film 431 is high. Thus, the entry of hydrogen and water existing outside the device into the interface between the sealant 405 and the inorganic insulating film 431 and into the inorganic insulating film 431 can be suppressed. Accordingly, the entry of hydrogen and water existing outside the device into the oxide semiconductor included in the transistor 251 can be suppressed.

The oxide semiconductor layer 205 included in the transistor is entirely covered with the gate insulating film 203 and the protective film 209. Such a structure is preferably employed to suppress the entry of impurities such as moisture contained in the device as well as impurities such as moisture existing outside the device into the oxide semiconductor layer 205.

When one embodiment of the present invention is thus applied, the display device can have high reliability; in the display device, impurities such as moisture existing outside a space surrounded by the substrate 401, the substrate 406, and the sealant 405 are less likely to enter the transistor (e.g., the oxide semiconductor).

Further, in this embodiment, the first gate insulating film 203a and the inorganic insulating film 431 are each an inorganic insulating film containing nitrogen. Thus, even when these films exist in an end portion of the display device, the entry of hydrogen and water existing outside the device into the films can be suppressed. Accordingly, the entry of hydrogen and water existing outside the device into the oxide semiconductor included in the transistor 251 can be suppressed.

Structural Example 8

FIG. 8A illustrates another example of a cross-sectional view taken along dashed-dotted lines A6-B6 and C6-D6 in FIG. 7A.

The pixel portion 402 illustrated in FIG. 8A includes the transistor 251 and the protective film 209 covering the transistor 251. The structures of these components are the same as those of Structural Example 1 (FIGS. 1A to 1D); thus, the detailed descriptions thereof are omitted. Further, the same applies to the spacer 425 and an insulating film serving as the alignment film 424.

The organic insulating film 407 is provided over the protective film 209, and the liquid crystal element 262 is provided over the organic insulating film 407. The liquid crystal element 262 is a liquid crystal element to which an in-plane switching (IPS) mode is applied and in which a pair of electrodes, that is, the lower electrode 421 and the upper electrode 422 are formed on the same surface (here, over the organic insulating film 407). The lower electrode 421 is electrically connected to one of a pair of electrodes of the transistor 251.

The wiring 416 is electrically connected to the FPC 418 through the anisotropic conductive film 419. The wiring 416 is formed using the same conductive layer as the pair of electrodes (source and drain electrodes) of the transistor 251.

In Structural Example 8, the sealant 405 is in contact with the inorganic insulating film 431 containing nitrogen. As the inorganic insulating film 431, a silicon nitride film is used. The inorganic insulating film 431 has an excellent effect of blocking hydrogen, water, and the like. Further, the adhesion between the sealant 405 and the inorganic insulating film 431 is high. Thus, the entry of hydrogen and water existing outside the device into the interface between the sealant 405 and the inorganic insulating film 431 and into the inorganic insulating film 431 can be suppressed. Accordingly, the entry of hydrogen and water existing outside the device into the oxide semiconductor included in the transistor 251 can be suppressed.

In Structural Example 8, the inorganic insulating film 431 covers side surfaces and the top surfaces of end portions of the organic insulating film 407 from regions on the outer side than the edges of the organic insulating film 407, so that the side surfaces of the end portions of the organic insulating film 407 are not exposed to the air. Therefore, moisture and the like in the air can be prevented from entering the display device, moreover, the transistor (e.g., the oxide semiconductor), through the organic insulating film 407. Further, the sealant 405 is preferably formed over the organic insulating film 407, in which case the frame size of the display device can be reduced.

The oxide semiconductor layer 205 included in the transistor is entirely covered with the gate insulating film 203 and the protective film 209. Such a structure is preferably employed to suppress the entry of impurities such as moisture contained in the device as well as impurities such as moisture existing outside the device into the oxide semiconductor layer 205.

Further, in this embodiment, the first gate insulating film 203a, the second gate insulating film 203b, the first protective film 209a, the second protective film 209b, the inorganic insulating film 431 are each an inorganic insulating film containing nitrogen. Thus, even when these films exist in an end portion of the display device, the entry of hydrogen and water existing outside the device into the films can be suppressed. Accordingly, the entry of hydrogen and water existing outside the device into the oxide semiconductor included in the transistor can be suppressed.

Structural Example 9

FIG. 8B illustrates another example of a cross-sectional view taken along dashed-dotted lines A6-B6 and C6-D6 in FIG. 7A.

The pixel portion 402 illustrated in FIG. 8B includes the transistor 251, the protective film 209 covering the transistor 251, the organic insulating film 407 over the protective film 209, and the light-emitting element 270 over the organic insulating film 407. The structures of these components are the same as those of Structural Example 3 (FIG. 3B); thus, the detailed descriptions thereof are omitted.

In Structural Example 9, the sealant 405 is in contact with the inorganic insulating film 431 containing nitrogen. As the inorganic insulating film 431, a silicon nitride film is used. The inorganic insulating film 431 has an excellent effect of blocking hydrogen, water, and the like. Further, the adhesion between the sealant 405 and the inorganic insulating film 431 is high. Thus, the entry of hydrogen and water existing outside the device into the interface between the sealant 405 and the inorganic insulating film 431 and into the inorganic insulating film 431 can be suppressed. Accordingly, the entry of hydrogen and water existing outside the device into the oxide semiconductor included in the transistor 251 can be suppressed.

Further, in Structural Example 9, the sealant 405 is provided on the outer side than a side surface of an end portion of the organic insulating film 407, so that the side surface of the end portion of the organic insulating film 407 is not exposed to the air. Therefore, the entry of moisture and the like in the air into the display device, moreover, the transistor (e.g., the oxide semiconductor), through the organic insulating film 407 can be suppressed.

The oxide semiconductor layer 205 included in the transistor is entirely covered with the gate insulating film 203 and the protective film 209. Such a structure is preferably employed to suppress the entry of impurities such as moisture contained in the device as well as impurities such as moisture existing outside the device into the oxide semiconductor layer 205.

When one embodiment of the present invention is thus applied, the display device can have high reliability; in the display device, impurities such as moisture existing outside a space surrounded by the substrate 401, the substrate 406, and the sealant 405 are less likely to enter the transistor (e.g., the oxide semiconductor). Therefore, even when a layer formed using the same organic material as the organic insulating film 407 (e.g., a resin layer 490 provided over the wiring 416) is present outside the space, degradation of reliability of the transistor and the display device due to impurities such as moisture contained in the layer can be suppressed.

Examples of materials which can be used for the display device of one embodiment of the present invention will be described below.

[Substrate]

For the substrate 401 and the substrate 406, a material which has heat resistance high enough to withstand at least heat treatment in the fabrication process is used. For example, a glass substrate, a ceramic substrate, a quartz substrate, or a sapphire substrate can be used. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used.

Still alternatively, a flexible substrate may be used as the substrate 401, and a base film and a transistor may be directly provided on the flexible substrate. Further, a separation layer may be provided between the substrate 401 and the base film. The separation layer can be used when part or the whole of an element formed over the separation layer is separated from the substrate 401 and transferred to another substrate. In such a case, the transistor can be transferred to a substrate having low heat resistance or a flexible substrate as well.

[Base Film]

Although a base film over the substrate 401 does not have to be provided unless needed, it is preferably provided, for example, to stabilize the characteristics of the transistor. As the base film, a silicon oxide film, a silicon oxynitride film, a silicon nitride film, a silicon nitride oxide film, a gallium oxide film, a hafnium oxide film, an yttrium oxide film, an aluminum oxide film, an aluminum oxynitride film, or the like can be used. When a silicon nitride film, a gallium oxide film, a hafnium oxide film, an yttrium oxide film, an aluminum oxide film, or the like is used as the base film, it is possible to suppress the diffusion of impurities (typified by an alkali metal, water, and hydrogen) from the substrate 401 into the oxide semiconductor layer 205. Note that in this specification, a "silicon oxynitride film" refers to a film which contains more oxygen than nitrogen, and a "silicon nitride oxide film" refers to a film which contains more nitrogen than oxygen.

[Sealant]

As the sealant 405, an organic resin such as a thermosetting resin or a photocurable resin, glass, or the like can be used. Since an inorganic material such as glass has a lower moisture permeability than a resin, the use of glass as the sealant 405 is preferable to the use of a resin in terms of an improvement in reliability of the display device.

When glass is used as the sealant 405, a nitrogen-containing inorganic insulating film in contact with the sealant 405 is preferably a film containing fewer degassing components. As degassing components are fewer, higher adhesion between glass and a layer in contact with the glass can be obtained when heat treatment is performed on glass frit. Thus, it is preferable to use a nitrogen-containing silicon film with a low concentration of hydrogen or a nitride insulating film which releases hydrogen molecules less than $5 \times 10^{21}$ molecules/cm$^3$ and ammonia molecules less than $1 \times 10^{22}$ molecules/cm$^3$, which will be described in Embodiment 2. The use of the above material leads to higher reliability of the display device.

Further, when glass is used as the sealant 405, a nitrogen-containing inorganic insulating film in contact with the sealant preferably contains oxygen. A frit paste including glass frit has high wettability to a layer containing oxygen; thus, high adhesion between the layer containing oxygen and the sealant can be achieved. Therefore, for example, the oxygen and nitrogen-containing inorganic insulating film given in this specification can be preferably used as a nitrogen-containing inorganic insulating film in contact with the sealant.

Alternatively, the sealant 405 may be a resin layer containing a drying agent. As the drying agent, for example, a substance which adsorbs moisture by chemical adsorption, such as an oxide of an alkaline earth metal (e.g., a calcium oxide or a barium oxide), can be used. Alternatively, a substance which adsorbs moisture by physical adsorption, such as zeolite or silica gel, may be used as the drying agent. The sealant preferably contains a drying agent because impurities such as moisture in a sealed region can be reduced and thus the reliability of an element such as the transistor can be improved.

[Space]

The space 408 may be filled with an inert gas such as an argon gas or a nitrogen gas or a solid such as an organic resin, or may be in a reduced pressure atmosphere. Further, a drying agent may be provided in the space 408.

[Organic Insulating Film]

For the organic insulating film 407, an organic material such as polyimide, acrylic, or a benzocyclobutene resin, or the like can be used. As the organic insulating film 407, an insulating film with a planarization function is preferably used in order to reduce surface unevenness due to the transistor. It is also possible to stack the organic insulating film 407 and an insulating film formed using a low-dielectric constant material (low-k material), an inorganic material, or the like.

[Partition]

The partition 429 is formed using an organic insulating material or an inorganic insulating material. It is particularly preferable that the partition be formed using a photosensitive resin material so that a sidewall of an opening has an inclined surface with continuous curvature.

[Liquid Crystal Element]

For the liquid crystal layer 423, thermotropic liquid crystal, ferroelectric liquid crystal, anti-ferroelectric liquid crystal, or the like can be used. Such a liquid crystal material may be a low molecular compound or a high molecular compound. Such a liquid crystal material (liquid crystal composition) exhibits a cholesteric phase, a smectic phase, a cubic phase, a chiral nematic phase, an isotropic phase, a blue phase, or the like depending on conditions. A liquid crystal composition exhibiting a blue phase has a short response time, and has optical isotropy, which contributes to the exclusion of the alignment process and reduction of viewing angle dependence. In addition, since an alignment film does not need to be provided and rubbing treatment is unnecessary, electrostatic breakdown caused by rubbing treatment can be prevented, so that defects and damage of the display device in the fabrication process can be reduced. Consequently, productivity of the display device can be improved.

For the display device, a twisted nematic (TN) mode, an IPS mode, an FFS mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

Alternatively, the display device may be a normally black display device such as a transmissive display device utilizing a vertical alignment (VA) mode. Some examples of the vertical alignment mode are a multi-domain vertical alignment (MVA) mode, a patterned vertical alignment (PVA) mode, and an advanced super view (ASV) mode.

In the display device, a black matrix (a light-blocking layer), an optical member (optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

As a display method in the pixel portion, a progressive method, an interlace method, or the like can be employed. Further, color elements controlled in a pixel at the time of color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the sizes of display regions may be different between respective dots of color elements. Note that the disclosed invention is not limited to the application to a display device for color display; the disclosed invention can also be applied to a display device for monochrome display.

[Color Filter, Black Matrix, and Overcoat Layer]

As a color filter, for example, a chromatic light-transmitting resin can be used. As the chromatic light-transmitting resin, a photosensitive organic resin or a non-photosensitive organic resin can be used. A photosensitive organic resin layer is preferably used, in which case the number of resist masks can be reduced, which results in the simplification of the process.

Chromatic colors are colors except achromatic colors such as black, gray, and white. A color filter is formed using a material which transmits only light of a chromatic color which the material is colored in. As the chromatic color, red, green, blue, or the like can be used. Alternatively, cyan, magenta, yellow, or the like may be used. "Transmitting only light of a chromatic color which a material is colored in" means that light passing through the color filter has a peak at a wavelength of the light of the chromatic color. The thickness of the color filter may be controlled as appropriate in consideration of the relation between the concentration of the coloring material to be included and the transmittance of light. For example, the color filter may have a thickness in the range of 1500 nm to 2000 nm.

A black matrix is provided between adjacent color filters. The black matrix can be formed using a material which blocks visible light; for example, a metal or an organic resin can be used. Note that the black matrix may be provided to overlap with a region other than a pixel portion; for example, the black matrix may be provided in a driver circuit portion.

In addition, an overcoat layer may be provided so as to cover the color filter and the black matrix. With the overcoat layer, impurities and the like contained in the color filter can be prevented from being diffused into an element. The overcoat layer is formed using a light-transmitting material; for example, an inorganic insulating material such as silicon nitride or silicon oxide or an organic insulating material such as acrylic or polyimide can be used.

[Light-Emitting Element]

As the light-emitting element, a light-emitting element utilizing electroluminescence, such as an organic EL element or an inorganic EL element, can be used.

In order to extract light emitted from the light-emitting element, at least one of a pair of electrodes thereof should have a light-transmitting property. There are a light-emitting element having a top emission structure in which light emission is extracted through the surface opposite to the substrate where a transistor and a light-emitting element are provided, a light-emitting element having a bottom emission structure in which light emission is extracted through the surface on the substrate side, and a light-emitting element having a dual emission structure in which light emission is extracted through the surface on the substrate side and the surface opposite to the substrate. A light-emitting element having any of these emission structures can be used in the display device of this embodiment.

A protective film for the light-emitting element may be formed over the upper electrode and the partition in order to prevent oxygen, hydrogen, moisture, carbon dioxide, and the like from entering the light-emitting element. As the protective film for the light-emitting element, a silicon nitride film, a silicon nitride oxide film, a diamond-like carbon (DLC) film, or the like can be formed. An inorganic insulating film containing nitrogen can be favorably used as the protective film for the light-emitting element. In the display device of one embodiment of the present invention, the protective film for the light-emitting element may be in contact with the sealant.

This embodiment can be freely combined with any of the other embodiments.

Embodiment 2

In this embodiment, a structure of a transistor which can be used for an embodiment of the present invention will be described with reference to FIGS. 9A to 9C. The transistor of this embodiment can be used in a pixel portion, a driver circuit, and the like of a display device of one embodiment of the present invention.

Figure 9A:
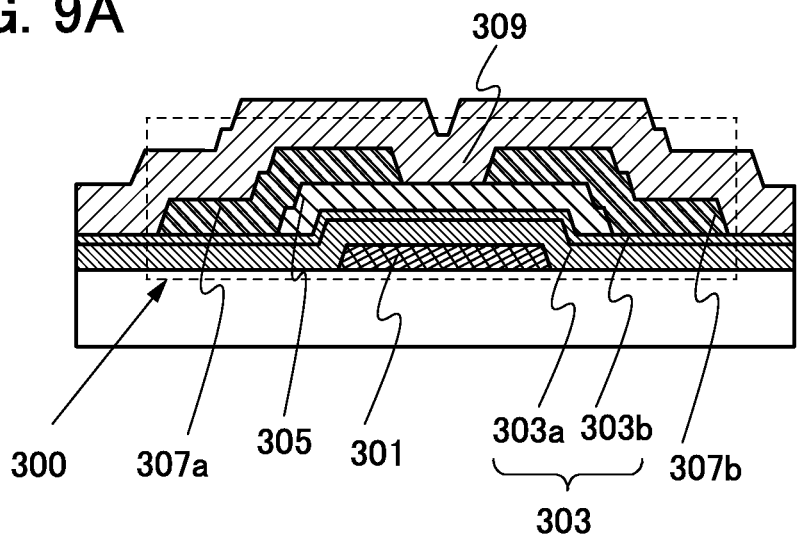
FIGS. 9A to 9C each illustrate an example of a transistor.

A transistor 300 illustrated in FIG. 9A includes a gate electrode 301, a gate insulating film 303 over the gate electrode 301, an oxide semiconductor layer 305 over the gate insulating film 303, and a pair of electrodes 307*a* and 307*b* (source and drain electrodes) which is electrically connected to the oxide semiconductor layer 305. The transistor 300 is covered with a protective film 309.

The gate insulating film 303 in the transistor 300 includes the following two layers: a first gate insulating film 303a in contact with the gate electrode 301 and a second gate insulating film 303b in contact with the oxide semiconductor layer 305.

A display device including a transistor has advantages of high productivity and low cost because a glass substrate of the eighth generation (2160 mm wide×2460 mm long) or later generations can be used for the display device. However, in the case of using such a glass substrate, because of its high insulating property and large area, an element and the like provided over the substrate might be damaged due to electrostatic discharge (ESD).

In view of the above, in the display device of one embodiment of the present invention, a silicon film containing nitrogen is provided as the gate insulating film 303. The silicon film containing nitrogen has a higher relative dielectric constant than a silicon oxide film and needs a larger thickness for equivalent capacitance. Thus, the physical thickness of the gate insulating film can be increased. Accordingly, a reduction in the withstand voltage of the transistor is suppressed and further the withstand voltage is improved, so that electrostatic breakdown of the display device can be suppressed.

Examples of the silicon film containing nitrogen are a silicon nitride film, a silicon nitride oxide film, and a silicon oxynitride film. A material with a higher nitrogen content has a higher relative dielectric constant; thus it is preferable to use a silicon nitride film. Further, a silicon oxide has an energy gap of 8 eV, whereas a silicon nitride has a small energy gap of 5.5 eV and accordingly has a low resistivity. Therefore, the use of a silicon nitride film can increase resistance to ESD. In addition, in the case where a silicon nitride film is formed by a CVD method, it is not necessary to use an $N_2O$ gas that is a greenhouse gas and is used when a silicon film containing oxygen and nitrogen such as a silicon nitride oxide film is formed by a CVD method.

In this embodiment, silicon nitride films are used as the first gate insulating film 303a and the second gate insulating film 303b. Thus, depending on materials or deposition conditions, the interface between the first gate insulating film 303a and the second gate insulating film 303b is unclear in some cases.

As the first gate insulating film 303a, a silicon nitride film which has a larger thickness than the second gate insulating film 303b and in which the number of defects is reduced is used. For example, the thickness of the first gate insulating film 303a is greater than or equal to 300 nm and less than or equal to 400 nm. Further, a silicon nitride film is used which has a spin density of $1\times10^{17}$ spins/cm$^3$ or less, preferably $5\times10^{16}$ spins/cm$^3$ or less, corresponding to a signal which appears at an Nc center (at a g-factor of 2.003) in electron spin resonance (ESR) spectroscopy. When such a silicon nitride film having a large thickness (e.g., 300 nm or more) and including a small number of defects is provided, the withstand voltage of the first gate insulating film 303a can be 300 V or more, for example.

As the second gate insulating film 303b, which is in contact with the oxide semiconductor layer 305, a silicon nitride film containing a lower concentration of hydrogen is used. The hydrogen concentration of the second gate insulating film 303b is lower than at least that of the first gate insulating layer 303b. For example, in the case where the first gate insulating film 303a and the second gate insulating film 303b are formed by a plasma CVD method, the hydrogen concentration in the second gate insulating film 303b can be made lower than that in the first gate insulating film 303a by decreasing the concentration of hydrogen contained in a supply gas. Specifically, in the case where silicon nitride films are formed as the first gate insulating film 303a and the second gate insulating film 303b, the second gate insulating film 303b may be formed at a lower ammonia flow rate than in a supply gas for forming the first gate insulating film 303a, or may be formed without using ammonia.

The thickness of the second gate insulating film 303b is greater than or equal to 25 nm and less than or equal to 150 nm. When a silicon nitride film having a lower hydrogen concentration is provided as the second gate insulating film 303b, the entry of hydrogen or a hydrogen compound (e.g., water) into the oxide semiconductor layer 305 can be suppressed. Hydrogen in an oxide semiconductor causes carriers to be generated and the threshold voltage of a transistor to be shifted in the negative direction. Thus, when a silicon nitride film containing a lower concentration of hydrogen is provided as the second gate insulating film 303b, the electrical characteristics of the transistor can be stabilized.

In terms of reductions of in-plane variation, mixing of particles, and film formation takt time (cycle time), it is effective to use a CVD method to form the gate insulating film 303. A CVD method is also effective in forming a film over a large-sized substrate.

In this embodiment, the first gate insulating film 303a and the second gate insulating film 303b are successively formed by a plasma CVD method. First, using a mixed gas of silane ($SiH_4$), nitrogen ($N_2$), and ammonia ($NH_3$) as a supply gas, a silicon nitride film is formed as the first gate insulating film 303a, and then the supply gas is changed to a mixed gas of silane ($SiH_4$) and nitrogen ($N_2$) and a silicon nitride film is formed as the second gate insulating film 303b.

The silicon nitride film formed by a plasma CVD method using a mixed gas of silane, nitrogen, and ammonia as a supply gas includes fewer defects than the silicon nitride film formed using a mixed gas of silane and nitrogen as a supply gas. Thus, the first gate insulating film 303a includes fewer defects than at least the second gate insulating film 303b, and can have a spin density of $1\times10^{17}$ spins/cm$^3$ or less, preferably $5\times10^{16}$ spins/cm$^3$ or less, corresponding to a signal which appears at an Nc center (at a g-factor of 2.003) in electron spin resonance (ESR) spectroscopy. A silicon nitride film formed using a mixed gas containing ammonia provides better coverage than that formed using a mixed gas of silane and nitrogen as a supply gas. Thus, it is effective to provide a silicon nitride film formed using the above mixed gas, as a gate insulating film in contact with the gate electrode 301.

Meanwhile, the second gate insulating film 303b formed with a source gas containing no ammonia has a lower concentration of hydrogen than the first gate insulating film 303a. When such a film is provided in contact with the oxide semiconductor layer 305, it is possible to suppress the entry of hydrogen from the second gate insulating film 303b into the oxide semiconductor layer 305.

When a stack of the first gate insulating film 303a having a large thickness and including fewer defects and the second gate insulating film 303b having a lower hydrogen concentration is used as the gate insulating layer 303, it is possible to obtain a favorable withstand voltage and, at the same time, reduce the diffusion of impurities such as hydrogen into the oxide semiconductor layer 305. Thus, it is possible to reduce ESD damage to the transistor including the gate insulating film 303 and stabilize the electrical characteristics of the transistor.

When the gate insulating film 303 in FIG. 9A is used for each structural example described in Embodiment 1, the above effects can be obtained, so that the display device can have higher reliability.

Particularly when the gate insulating film 303 in FIG. 9A is used as the gate insulating film 203 in Structural Examples 1 to 3 described in Embodiment 1, the first gate insulating film 303a formed of a silicon nitride film including fewer defects is in contact with the sealant 405. The first gate insulating film 303a is an inorganic insulating film containing nitrogen and thus has high adhesion to the sealant 405 and an excellent effect of blocking hydrogen, water, and the like. Thus, the first gate insulating film 303a can be favorably used as a layer in contact with the sealant 405; accordingly the display device can have high reliability.

In the display device of one embodiment of the present invention, a portion of the second gate insulating film 203b which overlaps with the sealant 405 is not removed and the second gate insulating film 203b formed of a silicon nitride film having a lower hydrogen concentration is in contact with the sealant 405, in some cases depending on a material used for the protective film. The second gate insulating film 303b in this embodiment is an inorganic insulating film containing nitrogen and thus has high adhesion to the sealant 405 and an excellent effect of blocking hydrogen, water, and the like; therefore, the second gate insulating film 303b can be favorably used as a layer in contact with the sealant 405 and accordingly, the display device can have high reliability.

The first gate insulating film 303a and the second gate insulating film 303b are each an inorganic insulating film containing nitrogen. Thus, even when these films exist in an end portion of the display device, the entry of hydrogen and water existing outside the device into the films can be suppressed. Accordingly, the entry of hydrogen and water existing outside the device into the oxide semiconductor included in the transistor can be suppressed.

Figure 9B:
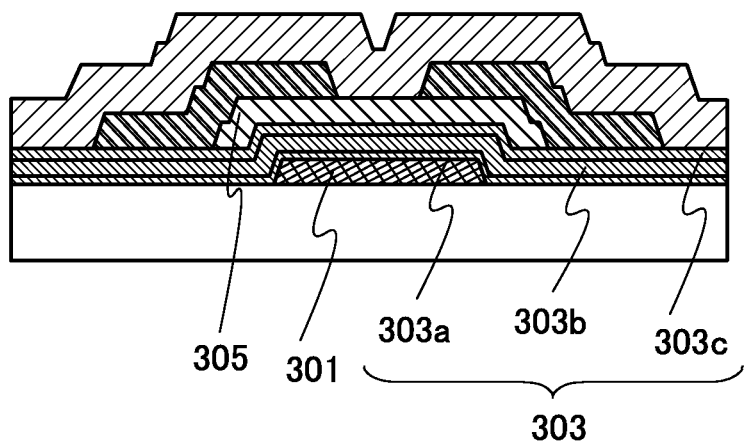

In the transistor illustrated in FIG. 9B, the gate insulating film 303 includes the first gate insulating film 303a in contact with the gate electrode 301, the second gate insulating film 303b over the first gate insulating film 303a, and a third gate insulating film 303c in contact with the oxide semiconductor layer 305. The first gate insulating film 303a and the second gate insulating film 303b can each have the above structure.

In a transistor including an oxide semiconductor, oxygen vacancies in an oxide semiconductor layer cause poor electrical characteristics of the transistor. Thus, the display device of one embodiment of the present invention is preferably provided with a transistor including fewer oxygen vacancies in an oxide semiconductor layer. When an oxide insulating film (preferably, an oxide insulating film in which the oxygen content is higher than that in the stoichiometric composition) is provided in contact with an oxide semiconductor layer, oxygen contained in the oxide insulating film can be diffused into the oxide semiconductor layer by heat treatment or the like. Consequently, oxygen vacancies in the oxide semiconductor layer can be reduced.

For the above reason, as the third gate insulating film 303c in contact with the oxide semiconductor layer 305, it is preferable to use an insulating film containing oxygen, such as a silicon oxide film, a gallium oxide film, or an aluminum oxide film. It is particularly preferable that the third gate insulating film 303c be an oxide insulating film in which the oxygen content is higher than that in the stoichiometric composition and from which part of oxygen is released by heat treatment. This is because oxygen can be supplied from the third gate insulating film 303c to the oxide semiconductor layer 305, so that the release of oxygen from the oxide semiconductor layer 305 can be prevented and oxygen vacancies can be filled. To form such an oxide insulating film, for example, the third gate insulating film 303c may be formed in an oxygen atmosphere. Alternatively, oxygen may be introduced into the third gate insulating film 303c which has been formed.

Figure 9C:
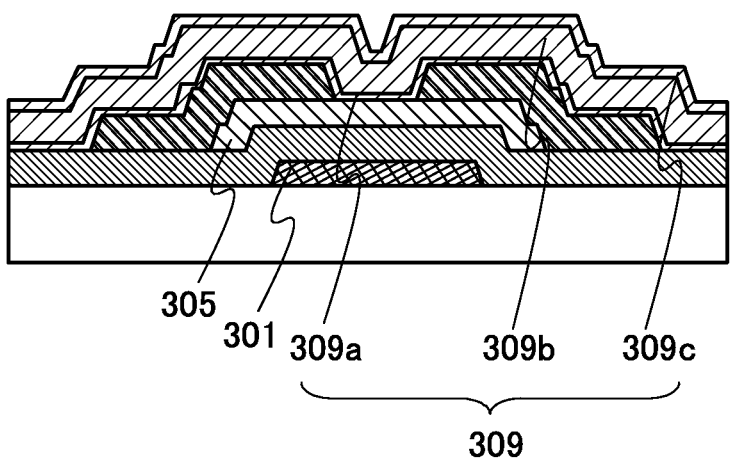

In the transistor illustrated in FIG. 9C, the protective film 309 includes the following three layers: a first protective film 309a provided in contact with the oxide semiconductor layer 305, a second protective film 309b provided in contact with the first protective film 309a, and a third protective film 309c provided in contact with the second protective film 309b.

The first protective film 309a is an oxide insulating film from which oxygen is diffused. Note that here, diffusion of oxygen includes the transfer of oxygen remaining in the first protective film 309a as well as the transfer of oxygen to the oxide semiconductor layer 305 through the first protective film 309a.

When an oxide insulating film from which oxygen is diffused is formed as the first protective film 309a, oxygen released from an oxide insulating film (the second protective film 309b) in which the oxygen content is higher than that in the stoichiometric composition and which is provided over the first protective film 309a can be diffused into the oxide semiconductor layer 305 through the first protective film 309a.

As the first protective film 309a, a silicon oxide film, a silicon oxynitride film, or the like having a thickness greater than or equal to 5 nm and less than or equal to 150 nm, preferably greater than or equal to 5 nm and less than or equal to 50 nm, more preferably greater than or equal to 10 nm and less than or equal to 30 nm can be used.

The second protective film 309b is formed in contact with the first protective film 309a. The second protective film 309b is an oxide insulating film in which the oxygen content is higher than that in the stoichiometric composition and from which part of oxygen is released by heat treatment.

As the second protective film 309b, a silicon oxide film, a silicon oxynitride film, or the like having a thickness greater than or equal to 30 nm and less than or equal to 500 nm, preferably greater than or equal to 150 nm and less than or equal to 400 nm can be used.

The formation of the oxide insulating film from which part of oxygen is released by heat treatment as the second protective film 309b over the first protective film 309a allows oxygen to be diffused into the oxide semiconductor layer 305 to fill oxygen vacancies in the oxide semiconductor layer 305. Alternatively, the second protective film 309b is formed over the first protective film 309a while a substrate is heated, whereby oxygen can be diffused into the oxide semiconductor layer 305 to fill oxygen vacancies in the oxide semiconductor layer 305. Still alternatively, the second protective film 309b is formed over the first protective film 309a and then heat treatment is performed, whereby oxygen can be diffused into the oxide semiconductor layer 305 to fill oxygen vacancies in the oxide semiconductor layer 305. Consequently, oxygen vacancies in the oxide semiconductor layer 305 can be reduced.

When the oxide insulating film in which the oxygen content is higher than that in the stoichiometric composition is provided over a back channel of the oxide semiconductor layer 305 (a surface of the oxide semiconductor layer 305 which is opposite to a surface facing the gate electrode 301) with the oxide insulating film from which oxygen is diffused provided therebetween, oxygen can be diffused into the back channel side of the oxide semiconductor layer 305, and oxygen vacancies on the back channel side can be reduced.

As the third protective film 309c, a nitride insulating film is used. Specifically, a nitride insulating film which releases hydrogen molecules less than $5 \times 10^{21}$ molecules/cm$^3$, preferably less than or equal to $3 \times 10^{21}$ molecules/cm$^3$, more preferably less than or equal to $1 \times 10^{21}$ molecules/cm$^3$, and ammonia molecules less than $1 \times 10^{22}$ molecules/cm$^3$, preferably less than or equal to $5 \times 10^{21}$ molecules/cm$^3$, more preferably less than or equal to $1 \times 10^{21}$ molecules/cm$^3$ by thermal desorption spectroscopy is preferably used. The amount of hydrogen released from the third protective film 309c and the amount of ammonia which is a source for supplying nitrogen are small; thus, the amount of hydrogen and nitrogen which are transferred to the oxide semiconductor layer 305 in the transistor is small.

Hydrogen contained in the oxide semiconductor layer 305 reacts with oxygen bonded to a metal atom to be water, and in addition, a vacancy is formed in a lattice from which oxygen is released (or a portion from which oxygen is released). In addition, the reaction of part of hydrogen and oxygen causes generation of electrons serving as carriers. Further, nitrogen contained in the oxide semiconductor layer 305 reacts with a metal element or oxygen, which causes generation of electrons serving as carriers. Thus, the transistor including the oxide semiconductor layer 305 tends to be normally on. Therefore, hydrogen and nitrogen in the oxide semiconductor layer 305 are reduced as much as possible, whereby a shift of the threshold voltage in the negative direction can be suppressed and variations in electrical characteristics can be reduced. Further, a leakage current between a source and a drain of the transistor, typically an off-state current, can be reduced.

Thus, when a nitride insulating film which releases a small number of hydrogen molecules and a small number of ammonia molecules is provided over the transistor, less hydrogen and ammonia are released from the nitride insulating film to the oxide semiconductor layer 305, so that the concentrations of hydrogen and nitrogen in the oxide semiconductor layer 305 can be low. Further, the third protective film 309c is provided over the transistor; therefore, the entry of water from the outside to the oxide semiconductor layer 305 can be suppressed. In other words, the entry of hydrogen contained in water to the oxide semiconductor layer 305 can be suppressed. As a result, a shift of the threshold voltage in the negative direction can be suppressed and variations in electrical characteristics can be reduced. Further, a leakage current between a source and a drain of the transistor, typically an off-state current, can be reduced.

As the third protective film 309c, a silicon nitride film, a silicon nitride oxide film, an aluminum nitride film, an aluminum nitride oxide film, or the like having a thickness greater than or equal to 50 nm and less than or equal to 200 nm can be formed.

In the case where a silicon nitride film is formed as the third protective film 309c by a plasma CVD method, a deposition gas containing silicon, nitrogen, and ammonia are used as source gases. As the source gas, ammonia whose amount is smaller than the amount of nitrogen is used, whereby ammonia is dissociated in the plasma and activated species are generated. The activated species cleave a bond between silicon and hydrogen which are contained in a deposition gas containing silicon and a triple bond between nitrogen atoms. As a result, a dense silicon nitride film having few defects, in which bonds between silicon and nitrogen are promoted and bonds between silicon and hydrogen is few, can be formed. On the other hand, when the amount of ammonia is larger than the amount of nitrogen in a source gas, cleavage of a deposition gas containing silicon and cleavage of nitrogen are not promoted, so that a sparse silicon nitride film in which bonds between silicon and hydrogen remain and defects are increased is formed. Therefore, in a source gas, the flow ratio of the nitrogen to the ammonia is set to be preferably greater than or equal to 5 and less than or equal to 50, more preferably greater than or equal to 10 and less than or equal to 50.

When the protective film 309 in FIG. 9C is used for each structural example described in Embodiment 1, the above effects can be obtained, so that the display device can have higher reliability.

Particularly when the protective film 309 in FIG. 9C is used as the protective film 209 in Structural Examples 4 and 5 described in Embodiment 1, the third protective film 309c formed of a nitride insulating film which releases a small number of hydrogen molecules and a small number of ammonia molecules is in contact with the sealant 405. The third protective film 309c is an inorganic insulating film containing nitrogen and thus has high adhesion to the sealant 405 and an excellent effect of blocking hydrogen, water, and the like. Thus, the third protective film 309c can be favorably used as a layer in contact with the sealant 405; accordingly, the display device can have high reliability.

Note that in the case where the oxide semiconductor layer 305 is not damaged in the formation process of the second protective film 309b, the second protective film 309b formed of an oxide insulating film from which part of oxygen is released by heat treatment may be provided in contact with the oxide semiconductor layer 205 without providing the first protective film 309a.

Alternatively, the protective film 309 may have a two-layer structure including the first protective film 309a provided in contact with the oxide semiconductor layer 305 and the second protective film 309b provided in contact with the first protective film 309a.

As wirings and electrodes of the display device of one embodiment of the present invention, a variety of conductive films can be used. For example, they can each be formed to have a single-layer structure or a layered structure using a metal element selected from aluminum, chromium, copper, tantalum, titanium, molybdenum, and tungsten; an alloy containing any of these metal elements as a component; an alloy containing any of these metal elements in combination; or the like. Alternatively, manganese or zirconium may be used. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, or a three-layer structure in which a titanium film, an aluminum film, and a titanium film are stacked in this order can be used.

Alternatively, any of the following can be used: a light-transmitting conductive material such as an indium tin oxide, an indium oxide containing tungsten oxide, an indium zinc oxide containing tungsten oxide, an indium oxide containing titanium oxide, an indium tin oxide containing titanium oxide, an indium zinc oxide, and an indium tin oxide to which silicon oxide is added. Still alternatively, a layered structure formed using the above light-transmitting conductive material and the above metal element may be employed.

An oxide semiconductor layer which can be used for one embodiment of the present invention will be described below.

<Oxide Semiconductor Layer>

An oxide semiconductor used for the oxide semiconductor layer 305 preferably contains at least indium (In) or zinc (Zn). Alternatively, the oxide semiconductor preferably contains both In and Zn. In order to reduce variations in electrical characteristics of the transistors including the oxide semiconductor, the oxide semiconductor preferably contains one or more stabilizers in addition to one of or both In and Zn.

Examples of stabilizers are gallium (Ga), tin (Sn), hafnium (Hf), aluminum (Al), and zirconium (Zr). The other examples of stabilizers are lanthanoids such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

For the oxide semiconductor, for example, any of the following can be used: an indium oxide, a tin oxide, a zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—W-based oxide, an In—Ga—Zn-based oxide, an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Here, for example, an "In—Ga—Zn-based oxide" means an oxide containing In, Ga, and Zn as its main components and there is no particular limitation on the ratio of In, Ga, and Zn. Further, the In—Ga—Z-based oxide may contain a metal element other than In, Ga, and Zn.

Alternatively, a material represented by $InMO_3(ZnO)_m$ (m>0, m is not an integer) may be used as the oxide semiconductor. Note that M represents one or more metal elements selected from Ga, Fe, Mn, and Co. Alternatively, as the oxide semiconductor, a material represented by $In_2SnO_5(ZnO)$, (n>0 is satisfied, n is an integer) may be used.

For example, an In—Ga—Zn-based metal oxide with an atomic ratio of In:Ga:Zn=1:1:1 (=1/3:1/3:1/3), In:Ga:Zn=2:2:1 (=2/5:2/5:1/5), In:Ga:Zn=3:1:2 (=1/2:1/6:1/3), or any of oxides whose composition is in the neighborhood of the above compositions can be used. Alternatively, an In—Sn—Zn-based metal oxide with an atomic ratio of In:Sn:Zn=1:1:1 (=1/3:1/3:1/3), In:Sn:Zn=2:1:3 (=1/3:1/6:1/2), In:Sn:Zn=2:1:5 (=1/4:1/8:5/8), or any of oxides whose composition is in the neighborhood of the above compositions may be used.

Note that without limitation to the materials given above, a material with an appropriate composition depending on semiconductor characteristics and electrical characteristics (field-effect mobility, threshold voltage, and the like) may be used. Further, it is preferable to appropriately set the carrier density, the impurity concentration, the defect density, the atomic ratio of a metal element and oxygen, the interatomic distance, the density, or the like in order to obtain necessary semiconductor characteristics and electrical characteristics.

Further, the off-state current of a transistor can be reduced with the use of an oxide semiconductor having a wide energy gap. Specifically, the energy gap of the oxide semiconductor is 2 eV or more, preferably 2.5 eV or more, more preferably 3 eV or more.

The structure of an oxide semiconductor film will be described below.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. The CAAC-OS film will be described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in the direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or the top surface of the CAAC-OS film, and is arranged in parallel to the formation surface or the top surface of the CAAC-OS film.

On the other hand, according to the TEM image of the CAAC-OS film observed in the direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in the direction substantially perpendicular to the formation surface or the top surface of the CAAC-OS film.

On the other hand, when the CAAC-OS film is analyzed by an in-plane method in which an X-ray enters a sample in the direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in the direction parallel to a normal vector of a formation surface or a normal vector of the top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axes of the crystals are aligned in the direction parallel to a normal vector of a formation surface or a normal vector of the top surface. Thus, for example, in the case where a shape of the CAAC-OS film is changed by etching or the like, the c-axis might not be necessarily parallel to a normal vector of a formation surface or a normal vector of the top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

In a transistor including the CAAC-OS film, change in electrical characteristics due to irradiation with visible light or ultraviolet light is small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

For example, the CAAC-OS film is formed by a sputtering method using a polycrystalline oxide semiconductor sputtering target. By collision of ions with the target, a crystal region included in the target may be separated from the target along an a-b plane; in other words, a flat-plate-like or pellet-like sputtered particle having a plane parallel to an a-b plane may flake off from the target. In that case, the sputtered particle reaches a substrate while maintaining their crystal state, whereby the CAAC-OS film can be formed.

For the formation of the CAAC-OS film, the following conditions are preferably used.

Reduction in amount of impurities entering the CAAC-OS film during the deposition can prevent the crystal state from being broken by the impurities. For example, the concentration of impurities (e.g., hydrogen, water, carbon dioxide, or nitrogen) existing in a deposition chamber is preferably reduced. Furthermore, the concentration of impurities in a deposition gas is preferably reduced. Specifically, a deposition gas whose dew point is −80° C. or lower, preferably −100° C. or lower is used.

When the substrate heating temperature during the deposition is increased, migration of sputtered particles occurs after the sputtered particles reach the substrate. Specifically, the substrate heating temperature during the deposition is higher than or equal to 100° C. and lower than or equal to 740° C., preferably higher than or equal to 200° C. and lower than or equal to 500° C. When the substrate heating temperature during the deposition is increased and flat-plate-like sputtered particles reach the substrate, migration occurs over the substrate, so that flat planes of the sputtered particles are attached to the substrate.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of the sputtering target, an In—Ga—Zn-based oxide target is described below.

The polycrystalline In—Ga—Zn-based oxide target is made by mixing InO$_X$ powder, GaO$_Y$ powder, and ZnO$_Z$ powder at a predetermined molar ratio, applying pressure, and performing heat treatment at a temperature higher than or equal to 1000° C. and lower than or equal to 1500° C. X, Y, and Z are each a given positive number. Here, the predetermined molar ratio of InO$_X$ powder to GaO$_Y$ powder and ZnO$_Z$ powder is, for example, 2:2:1, 8:4:3, 3:1:1, 1:1:1, 4:2:3, or 3:1:2. The kinds of powders and the molar ratio for mixing the powders may be determined as appropriate depending on the desired sputtering target.

Alternatively, the oxide semiconductor layer 305 may have a layered structure of a plurality of oxide semiconductor films. The plurality of oxide semiconductor films may be formed using either metal oxides with different compositions or the same constituent elements whose compositions are different from one another. For example, the first oxide semiconductor film may contain In, Ga, and Zn at an atomic ratio of 1:1:1, and the second oxide semiconductor film may contain In, Ga, and Zn at an atomic ratio of 3:1:2. Alternatively, the first oxide semiconductor film may contain In, Ga, and Zn at an atomic ratio of 1:3:2, and the second oxide semiconductor film may contain In, Ga, and Zn at an atomic ratio of 2:1:3.

In this case, in one of the first oxide semiconductor film and the second oxide semiconductor film, which is closer to a gate electrode (is positioned on the channel side), the In content is preferably higher than the Ga content. In the other which is farther from the gate electrode (on the back channel side), the In content is preferably lower than the Ga content.

Further, the oxide semiconductor layer 305 may have a three-layer structure of a first oxide semiconductor film, a second oxide semiconductor film, and a third oxide semiconductor film, in which the constituent elements of the first to third oxide semiconductor films are the same and the compositions of the constituent elements of the first to third oxide semiconductor films are different from one another. For example, the first oxide semiconductor film may contain In, Ga, and Zn at an atomic ratio of 1:3:2, the second oxide semiconductor film may contain In, Ga, and Zn at an atomic ratio of 3:1:2, and the third oxide semiconductor film may contain In, Ga, and Zn at an atomic ratio of 1:1:1.

An oxide semiconductor film containing less In than Ga and Zn at an atomic ratio has a higher insulating property than an oxide semiconductor film containing In, Ga, and Zn at an equal atomic ratio and an oxide semiconductor film containing more In than Ga, and Zn at an atomic ratio. In other words, the first oxide semiconductor film (containing In, Ga, and Zn at an atomic ratio of 1:3:2) given as an example above has a higher insulating property than the second oxide semiconductor film (containing In, Ga, and Zn at an atomic ratio of 3:1:2) and the third oxide semiconductor film (containing In, Ga, and Zn at an atomic ratio of 1:1:1).

Further, when the first oxide semiconductor film (containing In, Ga, and Zn at an atomic ratio of 1:3:2) has an amorphous structure, the insulating property is further improved. Accordingly, the second oxide semiconductor film and the third oxide semiconductor film serve as a channel region, and the first oxide semiconductor film serves as a gate insulating film.

Since the constituent elements of the first oxide semiconductor film and the second oxide semiconductor films are the same, the first oxide semiconductor film has fewer trap levels at the interface with the second oxide semiconductor film (the same applies to the second oxide semiconductor film and the third oxide semiconductor film). Therefore, when the oxide semiconductor layer 305 has the above structure, a variation in the threshold voltage of the transistor due to a change over time or a BT photostress test can be reduced.

In an oxide semiconductor, the s orbital of heavy metal mainly contributes to carrier transfer, and when the In content in the oxide semiconductor is increased, overlap of the s orbital is likely to be increased. Therefore, an oxide having a composition of In>Ga has higher mobility than an oxide having a composition of In≤Ga. Further, in Ga, the formation energy of oxygen vacancies is larger and thus oxygen vacancies are less likely to occur, than in In; therefore, the oxide having a composition of In≤Ga has more stable characteristics than the oxide having a composition of In>Ga.

An oxide semiconductor having a composition of In>Ga is used on the channel side, and an oxide semiconductor having a composition of In≤Ga is used on the back channel side; so that field-effect mobility and reliability of a transistor can be further improved.

Further, the first oxide semiconductor film, the second oxide semiconductor film, and the third oxide semiconductor film may be formed using oxide semiconductors having different crystallinities. That is, the first oxide semiconductor film, the second oxide semiconductor film, and the third oxide semiconductor film may each be formed using any of a single crystal oxide semiconductor, a polycrystalline oxide semiconductor, an amorphous oxide semiconductor, and a CAAC-OS, as appropriate. When an amorphous oxide semiconductor is used for any one of the first oxide semiconductor film, the second oxide semiconductor film, and the third oxide semiconductor film, internal stress of the oxide semiconductor layer 305 or external stress is reduced, change in characteristics of the transistor is reduced, and reliability of the transistor can be further improved.

On the other hand, an amorphous oxide semiconductor is likely to absorb an impurity which serves as a donor, such as hydrogen, and to generate oxygen vacancies, and thus easily becomes n-type. Thus, the oxide semiconductor film provided on the channel side is preferably formed using a crystalline oxide semiconductor film such as a CAAC-OS film.

When an amorphous oxide semiconductor is used for the oxide semiconductor film on the back channel side, oxygen vacancies are generated in the oxide semiconductor film due to etching treatment for forming a source electrode layer and a drain electrode layer, so that the oxide semiconductor film is likely to be n-type. For this reason, an oxide semiconductor having crystallinity is preferably used for the oxide semiconductor film on the back channel side.

The thickness of the oxide semiconductor layer 305 is greater than or equal to 1 nm and less than or equal to 100 nm, preferably greater than or equal to 1 nm and less than or equal to 50 nm, more preferably greater than or equal to 1 nm and less than or equal to 30 nm, still more preferably greater than or equal to 3 nm and less than or equal to 20 nm.

In the oxide semiconductor layer 305, the concentration of an alkali metal or an alkaline earth metal which is obtained by secondary ion mass spectrometry (SIMS) is preferably $1\times10^{18}$ atoms/cm$^3$ or less, more preferably $2\times10^{16}$ atoms/cm$^3$ or less. This is because an alkali metal and an alkaline earth metal bonded to an oxide semiconductor might generate carriers, in which case the off-state current of the transistor is increased.

Further, the hydrogen concentration in the oxide semiconductor layer 305, which is obtained by secondary ion mass spectrometry, is preferably less than $5\times10^{18}$ atoms/cm$^3$, more preferably less than or equal to $1\times10^{18}$ atoms/cm$^3$, still more preferably less than or equal to $5\times10^{17}$ atoms/cm$^3$, particularly preferably less than or equal to $1\times10^{16}$ atoms/cm$^3$.

Hydrogen contained in the oxide semiconductor layer 305 reacts with oxygen bonded to a metal atom to form water, and a defect is generated in a lattice from which oxygen is released (or a portion from which oxygen is released). In addition, a bond of part of hydrogen and oxygen causes generation of electrons serving as carriers. Thus, it is preferable to reduce the hydrogen concentration in the oxide semiconductor film by reducing the impurities containing hydrogen as much as possible in the step of forming the oxide semiconductor film. When an oxide semiconductor film which is highly purified by removing hydrogen as much as possible is used for a channel region, a shift of the threshold voltage in the negative direction can be reduced, and the leakage current between a source and a drain of the transistor can be reduced, leading to an improvement in the electrical characteristics of the transistor. Typically, the off-state current (a value obtained by dividing the off-state current by the channel width of the transistor) can be decreased to several yA/µm to several zA/µm.

The oxide semiconductor layer 305 may contain nitrogen at a concentration of lower than or equal to $5\times10^{18}$ atoms/cm$^3$.

This embodiment can be freely combined with any of the other embodiments.

Embodiment 3

In this embodiment, electronic devices to which one embodiment of the present invention is applied will be described with reference to FIGS. 10A to 10E.

Examples of such an electronic device for which a display device of one embodiment of the present invention is used include the following: television sets; monitors for computers or the like; cameras such as digital cameras or digital video cameras; digital photo frames; mobile phones; portable game machines; portable information terminals; audio reproducing devices; and large game machines such as pachinko machines. FIGS. 10A to 10E illustrate specific examples of these electronic devices.

Figure 10A:
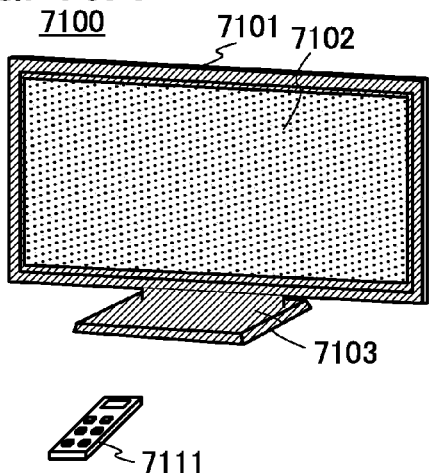
FIGS. 10A to 10E illustrate examples of electronic devices.

In a television set 7100 illustrated in FIG. 10A, a display portion 7102 is incorporated in a housing 7101. The display portion 7102 is capable of displaying images. For example, the display device of one embodiment of the present invention can be used for the display portion 7102. In addition, here, the housing 7101 is supported by a stand 7103.

The television set 7100 can be operated by an operation switch of the housing 7101 or a separate remote controller 7111. With operation keys of the remote controller 7111, channels and volume can be controlled and images displayed on the display portion 7102 can be controlled. Further, the remote controller 7111 may be provided with a display portion for displaying data output from the remote controller 7111.

The television set 7100 is provided with a receiver, a modem, and the like. With the receiver, a general television broadcast can be received. Furthermore, when the television set 7100 is connected to a communication network by wired or wireless connection via the modem, one-way (from a transmitter to a receiver) or two-way (between a transmitter and a receiver, between receivers, or the like) data communication can be performed.

Figure 10B:
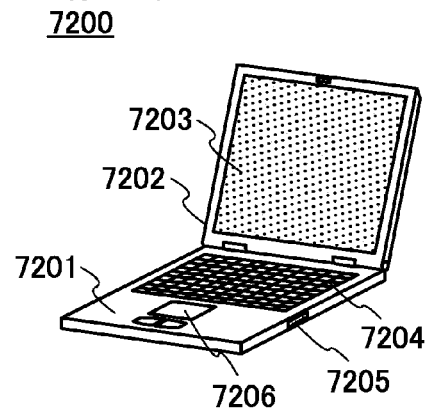

A computer 7200 illustrated in FIG. 10B includes a main body 7201, a housing 7202, a display portion 7203, a keyboard 7204, an external connecting port 7205, a pointing device 7206, and the like. The computer is fabricated using the display device of one embodiment of the present invention for the display portion 7203.

Figure 10C:
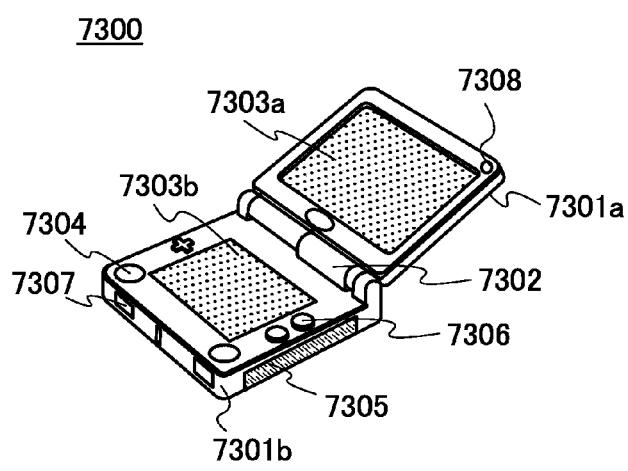

A portable game machine 7300 illustrated in FIG. 10C includes two housings, a housing 7301a and a housing 7301b, which are connected with a joint portion 7302 so that the portable game machine can be opened or folded. A display portion 7303a is incorporated in the housing 7301a and a display portion 7303b is incorporated in the housing 7301b. In addition, the portable game machine 7300 includes a speaker portion 7304, a recording medium insertion portion 7305, operation keys 7306, a connection terminal 7307, a sensor 7308 (a sensor having a function of measuring force, displacement, position, speed, acceleration, angular velocity, rotational speed, distance, light, liquid, magnetism, temperature, chemical substance, sound, time, hardness, electric field, current, voltage, electric power, radiation, flow rate, humidity, gradient, vibration, smell, or infrared ray), an LED lamp, a microphone, and the like. It is needless to say that the structure of the portable game machine is not limited to the above, and another accessory may be provided as appropriate. The portable game machine 7300 has a function of reading a program or data stored in a recording medium to display it on the display portion, and a function of sharing data with another portable game machine by wireless communication. Note that a function of the portable game machine is not limited to the above, and the portable game machine can have a variety of functions.

Figure 10D:
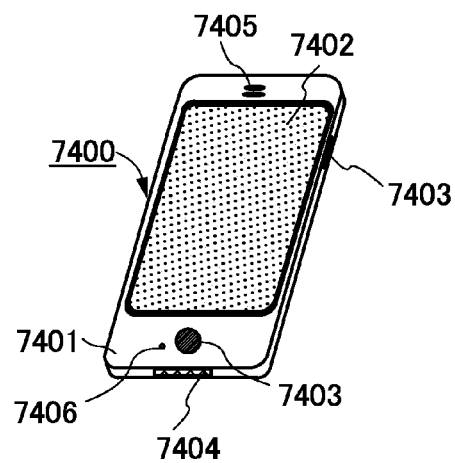

The mobile phone 7400 illustrated in FIG. 10D is provided with operation buttons 7403, an external connection port 7404, a speaker 7405, a microphone 7406, and the like, in addition to a display portion 7402 incorporated in a housing 7401. Note that the mobile phone 7400 is fabricated using the display device of one embodiment of the present invention for the display portion 7402.

When the display portion 7402 of the mobile phone 7400 is touched with a finger or the like, data can be input into the mobile phone 7400. Further, operations such as making a call and creating an e-mail can be performed with the touch of a finger or the like on the display portion 7402.

There are mainly three screen modes of the display portion 7402. The first mode is a display mode mainly for displaying images. The second mode is an input mode mainly for inputting data such as text. The third mode is a display-and-input mode in which two modes of the display mode and the input mode are combined.

For example, in the case of making a call or composing an e-mail, a text input mode mainly for inputting text is selected for the display portion 7402 so that characters displayed on a screen can be inputted.

When a sensing device including a sensor for sensing inclination, such as a gyroscope sensor or an acceleration sensor, is provided inside the mobile phone 7400, display on the screen of the display portion 7402 can be automatically changed by determining the orientation of the mobile phone 7400 (whether the mobile phone is placed/held horizontally or vertically for a landscape mode or a portrait mode).

The screen modes are switched by touching the display portion 7402 or operating the operation buttons 7403 of the housing 7401. Alternatively, the screen modes can be switched depending on kinds of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed within a specified period while a signal detected by an optical sensor in the display portion 7402 is detected, the screen mode may be controlled so as to be switched from the input mode to the display mode.

The display portion 7402 may function as an image sensor. For example, an image of a palm print, a fingerprint, or the like is taken with the touch of the palm or the finger on the display portion 7402, whereby personal authentication can be performed. Further, by providing a backlight or a sensing light source which emits a near-infrared light in the display portion, an image of a finger vein, a palm vein, or the like can be taken.

Figure 10E:
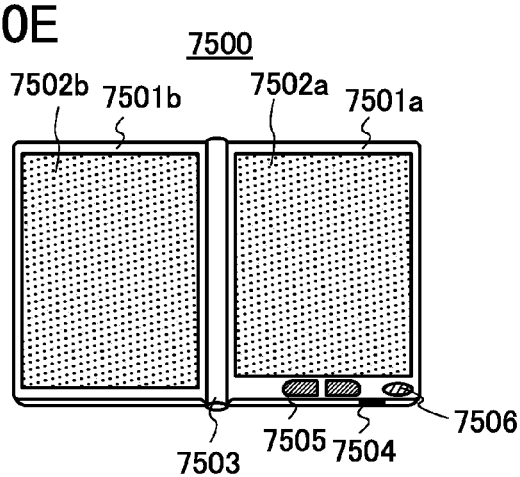

FIG. 10E illustrates an example of a foldable tablet terminal (which is unfolded). A tablet terminal 7500 includes a housing 7501a, a housing 7501b, a display portion 7502a, and a display portion 7502b. The housing 7501a and the housing 7501b are connected with a hinge 7503 and can be opened and closed along the hinge 7503. The housing 7501a includes a power switch 7504, operation keys 7505, a speaker 7506, and the like. Note that the tablet terminal 7500 is fabricated using the display device of one embodiment of the present invention for either the display portion 7502a or the display portion 7502b, or both of them.

At least part of the display portion 7502a or the display portion 7502b can be used as a touch panel region, where data can be input by touching displayed operation keys. For example, the entire area of the display portion 7502a can display keyboard buttons and serve as a touch panel while the display portion 7502b is used as a display screen.

This embodiment can be freely combined with any of the other embodiments.

This application is based on Japanese Patent Application serial no. 2012-184336 filed with the Japan Patent Office on Aug. 23, 2012, the entire contents of which are hereby incorporated by reference.

What is claimed is:

1. A display device comprising:
   a first substrate;
   a transistor over the first substrate, the transistor comprising:
      a gate electrode;
      an oxide semiconductor layer;
      a first inorganic insulating film between the gate electrode and the oxide semiconductor layer; and
      source and drain electrodes electrically connected to the oxide semiconductor layer;
      a protective film over the source and drain electrodes;
   an organic insulating film over the transistor;
   a second inorganic insulating film covering a side surface and a top surface of an end portion of the organic insulating film,
   a display element over the inorganic insulating film, the display element being electrically connected to one of the source electrode and the drain electrode;
   a second substrate facing the first substrate;
   a first wiring in direct contact with the first inorganic insulating film;
   a sealant between the first substrate and the second substrate, the sealant surrounding the transistor; and
   a second wiring outside the sealant, the second wiring electrically connected to the first wiring;
   wherein the second inorganic insulating film comprises nitrogen,
   wherein the second inorganic film comprises a region outside the organic insulating film and under the sealant,
   wherein the region of the second inorganic insulating film overlaps with the protective film, the first wiring and the sealant,
   wherein the second inorganic insulating film is in direct contact with a top surface of the protective film,
   wherein the sealant covers the side surface of the organic insulating film with the second inorganic insulating film therebetween,
   wherein the second inorganic insulating film is provided in an entire region in which the sealant overlaps with a top surface of the organic insulating film,
   wherein the second inorganic insulating film overlaps with the second wiring,
   wherein the protective film comprises a first protective film, a second protective film over the first protective film, a third protective film over the second protective film, and
   wherein ammonia molecules released from the third protective film in a thermal desorption spectroscopy is less than $1\times10^{22}/cm^3$.

2. The display device according to claim 1, wherein the sealant comprises glass.

3. The display device according to claim 1,
   wherein the second substrate is provided with a third inorganic insulating film comprising nitrogen, and
   wherein the sealant is in contact with the third inorganic insulating film.

4. The display device according to claim 1, wherein the second inorganic insulating film comprises a silicon nitride film.

5. The display device according to claim 1, wherein the display element is a liquid crystal element.

6. The display device according to claim 1, wherein the display element is a light-emitting element.

7. A display device comprising:
   a first substrate;
   a transistor over the first substrate, the transistor comprising:
      a gate electrode;
      an oxide semiconductor layer;
      a first inorganic insulating film between the gate electrode and the oxide semiconductor layer; and
      source and drain electrodes electrically connected to the oxide semiconductor layer;
      a protective film over the source and drain electrodes;
   an organic insulating film over the transistor;
   a second inorganic insulating film covering a side surface and a top surface of an end portion of the organic insulating film,
   a display element over the inorganic insulating film, the display element being electrically connected to one of the source electrode and the drain electrode;
   a second substrate facing the first substrate;
   a wiring in direct contact with the first inorganic insulating film; and
   a sealant between the first substrate and the second substrate, the sealant surrounding the transistor,
   wherein the second inorganic insulating film comprises nitrogen,
   wherein the second inorganic film comprises a region outside the organic insulating film and under the sealant,
   wherein the region of the second inorganic insulating film overlaps with the protective film, the wiring and the sealant,
   wherein the protective film overlaps with the wiring under the region of the second inorganic insulating film,
   wherein the second inorganic insulating film is in direct contact with a top surface of the protective film,
   wherein the sealant covers the side surface of the organic insulating film with the second inorganic insulating film therebetween,
   wherein the second inorganic insulating film is provided in an entire region in which the sealant overlaps with a top surface of the organic insulating film,
   wherein the protective film comprises a first protective film, a second protective film over the first protective film, a third protective film over the second protective film, and
   wherein ammonia molecules released from the third protective film in a thermal desorption spectroscopy is less than $1\times10^{22}/cm^3$.

8. The display device according to claim 7, wherein the sealant comprises glass.

9. The display device according to claim 7,
   wherein the second substrate is provided with a third inorganic insulating film comprising nitrogen, and
   wherein the sealant is in contact with the third inorganic insulating film.

10. The display device according to claim 7, wherein the second inorganic insulating film comprises a silicon nitride film.

11. The display device according to claim 7, wherein the display element is a liquid crystal element.

12. The display device according to claim 7, wherein the display element is a light-emitting element.

* * * * *